United States Patent
Nair et al.

(10) Patent No.: US 11,138,292 B1
(45) Date of Patent: Oct. 5, 2021

(54) CIRCUIT AND METHOD FOR COMPUTING DEPTHWISE CONVOLUTION

(71) Applicant: FACEBOOK, INC., Menlo Park, CA (US)

(72) Inventors: Krishnakumar Nair, Newark, CA (US); Abdulkadir Utku Diril, Menlo Park, CA (US); Dheevatsa Mudigere, Fremont, CA (US); Ehsan Khish Ardestani Zadeh, San Jose, CA (US); Olivia Wu, Los Altos, CA (US); Yuchen Hao, Fremont, CA (US)

(73) Assignee: FACEBOOK, INC., Menlo Park, CA (US)

( * ) Notice: Subject to any disclaimer, the term of this patent is extended or adjusted under 35 U.S.C. 154(b) by 231 days.

(21) Appl. No.: 16/414,703

(22) Filed: May 16, 2019

(51) Int. Cl.
  *G06F 17/16* (2006.01)
  *H03H 17/02* (2006.01)
(52) U.S. Cl.
  CPC ............ *G06F 17/16* (2013.01); *H03H 17/02* (2013.01)
(58) Field of Classification Search
  CPC .................................. G06F 17/16; H03H 17/02
  USPC .................................. 708/300–323, 420–421
  See application file for complete search history.

(56) References Cited

U.S. PATENT DOCUMENTS

| | | | |
|---|---|---|---|
| 10,445,638 B1 * | 10/2019 | Amirineni | G06F 17/16 |
| 2018/0173676 A1 * | 6/2018 | Tsai | G06F 17/16 |
| 2020/0349216 A1 * | 11/2020 | Das Sarma | G06N 3/063 |

* cited by examiner

*Primary Examiner* — Tan V Mai
(74) *Attorney, Agent, or Firm* — Morgan, Lewis & Bockius LLP

(57) ABSTRACT

An electronic circuit performs depthwise convolution of an input matrix with a kernel matrix to generate an output matrix. In each of a plurality of rounds of operations, a row of kernel matrix elements is selected for the round of operations, and applied to the input matrix to obtain an intermediate data array corresponding to the selected row of kernel elements. The electronic circuit includes a plurality of subcircuits operable in parallel to generate, in each operation, a set of intermediate data elements in the intermediate data array. Each subcircuit generates a respective intermediate data element that is the sum of a respective row of the input matrix elements weighted by a set of weight elements including the selected row of kernel elements and at least one zero element. The selected row of kernel elements is successively shifted among the set of weight elements in the round of operations.

20 Claims, 19 Drawing Sheets

CIRCUIT AND METHOD FOR COMPUTING DEPTHWISE CONVOLUTION

TECHNICAL FIELD

The disclosed implementations relate generally to neural networks and more specifically to a circuit and method for calculating depthwise convolution.

BACKGROUND

Depthwise convolution is used in many Convolutional Neural Networks (CNNs) today. CNNs are a class of deep neural networks used in pattern recognition and image classification. CNNs have one or more convolution layers that convolve an input image using filters to generate a stack of filtered images. Each convolutional layer includes neurons that calculates dot products of the input image and a respective set of filters. Typically, the input image and filters lead to a large number of parameters. Depthwise convolution is used to avoid overfitting that is common in standard convolution due to the large number of parameters. In depthwise convolution, the filter and input image are each broken into different channels, and each corresponding channel of the input image is convolved by striding a corresponding channel of the filter. Conventional hardware for carrying out convolution striding includes complicated circuits and memory organization, resulting in reduced efficiency.

SUMMARY

Accordingly, there is a need for a circuit and method to map depthwise convolution onto hardware, and to efficiently calculate depthwise convolution in CNNs. The circuit and method described herein uses parallel hardware (e.g., vector matrix multiplication hardware) to efficiently calculate depthwise convolution in a concurrent fashion, and to harvest redundancies inherent in depthwise convolution to optimize computations.

In one aspect, a circuit is provided for computing depthwise convolution. The circuit includes an array of input registers configured to hold an input data array organized in as an input matrix. The input matrix includes a plurality of input vectors each having a set of input data elements in the input data array. The array of input registers includes a plurality of groups of input registers, and each group of input registers is configured to hold a respective input vector. The circuit also includes a first buffer configured to buffer a filter matrix that includes a plurality of rows of filter elements. The circuit further includes a plurality of subcircuits. A respective subcircuit of the plurality of subcircuits has a first set of inputs coupled to respective input registers in a corresponding group of input registers, and a second set of inputs configured to receive in parallel a set of weight elements. The set of weight elements includes a selected row of filter elements and at least one zero element. The plurality of subcircuits is configured to operate in parallel to generate an intermediate data array corresponding to the selected row of filter elements. The intermediate data array includes a plurality of sets of intermediate data elements. A respective set of intermediate data elements is generated in parallel by at least a subset of the plurality of subcircuits upon receiving the selected row of filter elements at a respective subset of the second set of inputs in each of the subset of the plurality of subcircuits. The circuit also includes a second buffer configured to buffer the intermediate data array, and a summing module coupled to the second buffer and configured to generate an output matrix by summing a plurality of intermediate data arrays. The plurality of intermediate data arrays corresponds to respective rows of the plurality of rows of filter elements.

In some implementations, each set of intermediate data elements is generated in parallel in a respective one of a plurality of successive operations. The selected row of filter elements is successively shifted among the set of weight elements so as to be received by different subsets of the second set of inputs in different operations of the plurality of successive operations. In some implementations, the circuit further includes a set of weight holders configured to hold the set of weight elements, wherein the set of weight holders is configured to hold the selected row of filter elements in a respective subset of consecutive weight holders and to hold the at least one zero element in one or more weight holders other than the respective subset of consecutive weight holders for each operation of the plurality of successive operations. In some implementations, the set of weight holders is configured to successively shift the set of weight elements held therein such that the subset of consecutive weight holders holding the selected row of filter elements is successively shifted among the set of weight holders. In some implementations, the number of weight holders in the set of weight holders equals the number of input registers in each group of input registers.

In some implementations, the second buffer includes a set of buffer elements and a buffer array. The set of buffer elements are configured to receive the respective set of intermediate data elements from the at least a subset of the plurality of subcircuits and to transfer the respective set of intermediate data elements to the buffer array. The buffer array is configured to hold the intermediate data array corresponding to the selected row of filter elements.

In some implementations, the plurality of intermediate data arrays includes a first intermediate data array corresponding to a first row of filter elements, a second intermediate data array corresponding to a second row of filter elements, and a third intermediate data array corresponding to a third row of filter elements.

In some implementations, each subcircuit of the at least a subset of the plurality of subcircuits includes a plurality of multiplier circuits and a plurality of adder circuits to generate a weighted sum of a corresponding input vector using at least the selected row of filter elements received at the respective subset of the second set of inputs. In some implementations, each multiplier circuit is coupled to a respective input of the first set of inputs and a respective input of the second set of inputs, and configured to compute and output a respective product based on a respective input data element received at the respective input of the first set of inputs and a respective weight element received at the respective input of the second set of inputs. The plurality of adder circuits form an adder tree, to progressively sum up outputs from the plurality of multiplier circuits to generate the weighted sum.

In another aspect, a method of computing depthwise convolution using vector matrix multiplication is provided. The method is performed in an electronic circuit. The method includes loading an input matrix into a plurality of groups of input registers. The input matrix includes a plurality of input vectors, each group of input registers configured to hold a respective input vector. The method also includes applying a filter matrix to the plurality of input vectors to obtain a plurality of intermediate data arrays corresponding to respective rows of filter elements in the filter matrix. The method further includes summing the plurality of intermediate data arrays to obtain an output matrix. Applying the filter matrix to the plurality of input vectors includes operating a plurality of subcircuits in parallel to generate an intermediate data array corresponding to a selected row of filter elements. Each subcircuit of the plurality of subcircuits has a first set of inputs coupled to respective input registers in a corresponding group of input registers, and a second set of inputs configured to receive in parallel a set of weight elements. The set of weight elements includes the selected row of filter elements and at least one zero element. The intermediate data array corresponding to the selected row of filter elements includes a plurality of sets of intermediate data elements. A respective set of intermediate data elements is generated in parallel by at least a subset of the plurality of subcircuits upon receiving the selected row of filter elements at a respective subset of the second set of inputs in each of the subset of the plurality of subcircuits.

In some implementations, each set of intermediate data elements is generated in parallel in a respective one of a plurality of successive operations. The selected row of filter elements is successively shifted among the set of weight elements so as to be received by different subsets of the second set of inputs in different operations of the plurality of successive operations. In some implementations, the method further includes loading the set of weight elements into a set of weight holders such that the set of weight holders holds the selected row of filter elements in a subset of consecutive weight holders and the at least one zero element in weight holders other than the subset of consecutive weight holders. In some implementations, the set of weight elements held in the set of weight holders is successively shifted such that the subset of consecutive weight holders holding the selected row of filter elements is successively shifted among the set of weight holders. In some implementations, the number of weight holders in the set of weight holders equals the number of input registers in each group of input registers.

In some implementations, the method further includes buffering the intermediate data array using a buffer that includes a set of buffer elements and a buffer array. The method further includes receiving the respective set of intermediate data elements at the set of buffer elements from the at least a subset of the plurality of subcircuits; and transferring the respective set of intermediate data elements to the buffer array. The buffer array holds the intermediate data array corresponding to the selected row of filter elements.

In some implementations, the plurality of intermediate data arrays includes a first intermediate data array corresponding to a first row of filter elements, a second intermediate data array corresponding to a second row of filter elements, and a third intermediate data array corresponding to a third row of filter elements.

In some implementations, each subcircuit of the at least a subset of the plurality of subcircuits includes a plurality of multiplier circuits and a plurality of adder circuits. The method further includes operating the plurality of multiplier circuits and the plurality of adder circuits to generate a weighted sum of a corresponding input vector using at least the selected row of filter elements received at the respective subset of the second set of inputs. In some implementations, each multiplier circuit is coupled to a respective input of the first set of inputs and a respective input of the second set of inputs. The method further includes computing a respective product, by each multiplier circuit, based on a respective input data element received at the respective input of the first set of inputs and a respective weight element received at the respective input of the second set of inputs. The plurality of adder circuits form an adder tree. The method further includes progressively summing up, by the plurality of adder circuits, outputs from the plurality of multiplier circuits to generate the weighted sum.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 5A and 5B are tables illustrating inputs, intermediate results, and the various steps in calculating depthwise convolution, according to some implementations.

DESCRIPTION OF IMPLEMENTATIONS

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

It will also be understood that, although the terms first, second, etc. are, in some instances, used herein to describe various elements, these elements should not be limited by these terms. These terms are only used to distinguish one element from another. For example, a first electronic device could be termed a second electronic device, and, similarly, a second electronic device could be termed a first electronic device, without departing from the scope of the various described implementations. The first electronic device and the second electronic device are both electronic devices, but they are not necessarily the same electronic device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Figure 1A:
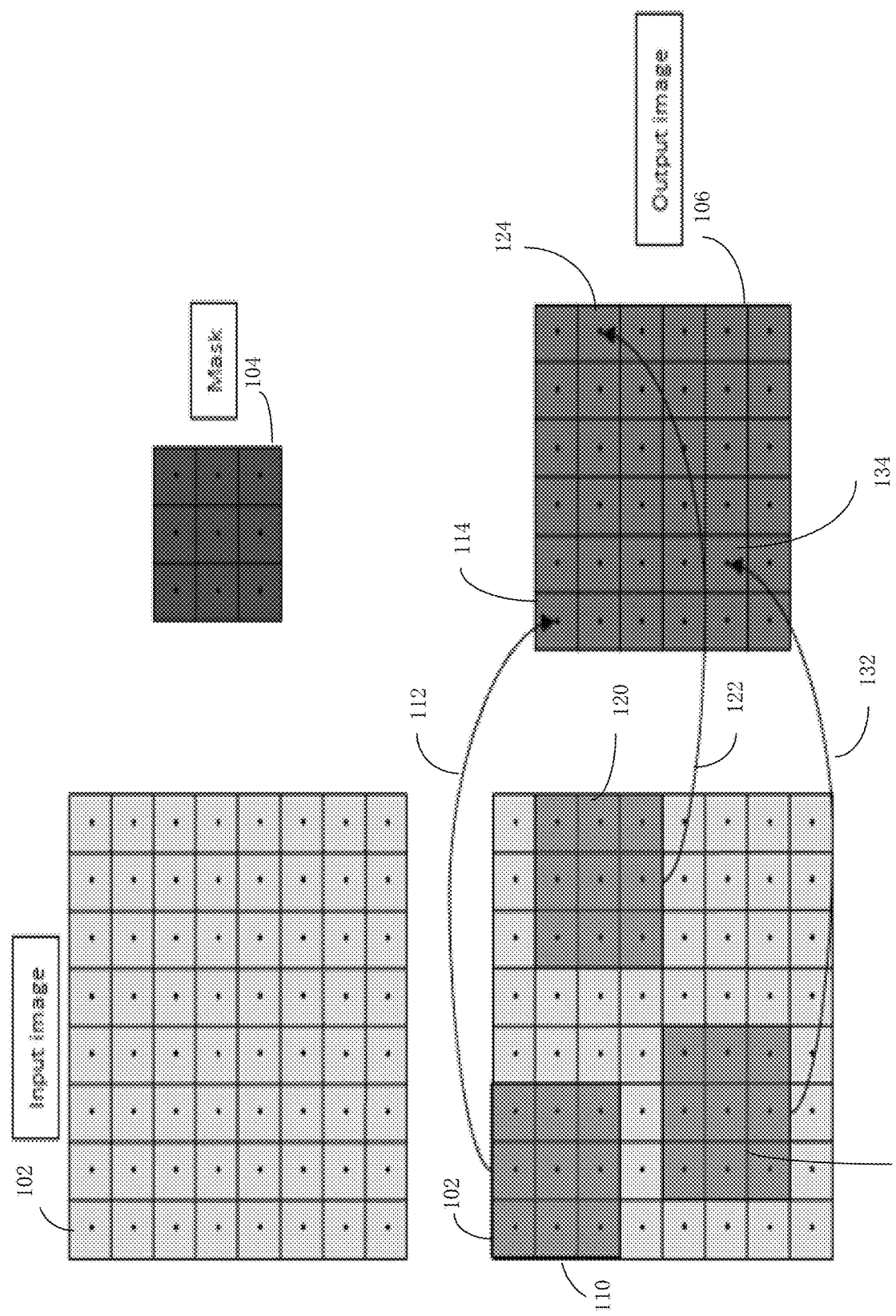
FIGS. 1A and 1B illustrate depthwise convolution, according to some implementations.
Figure 1B:
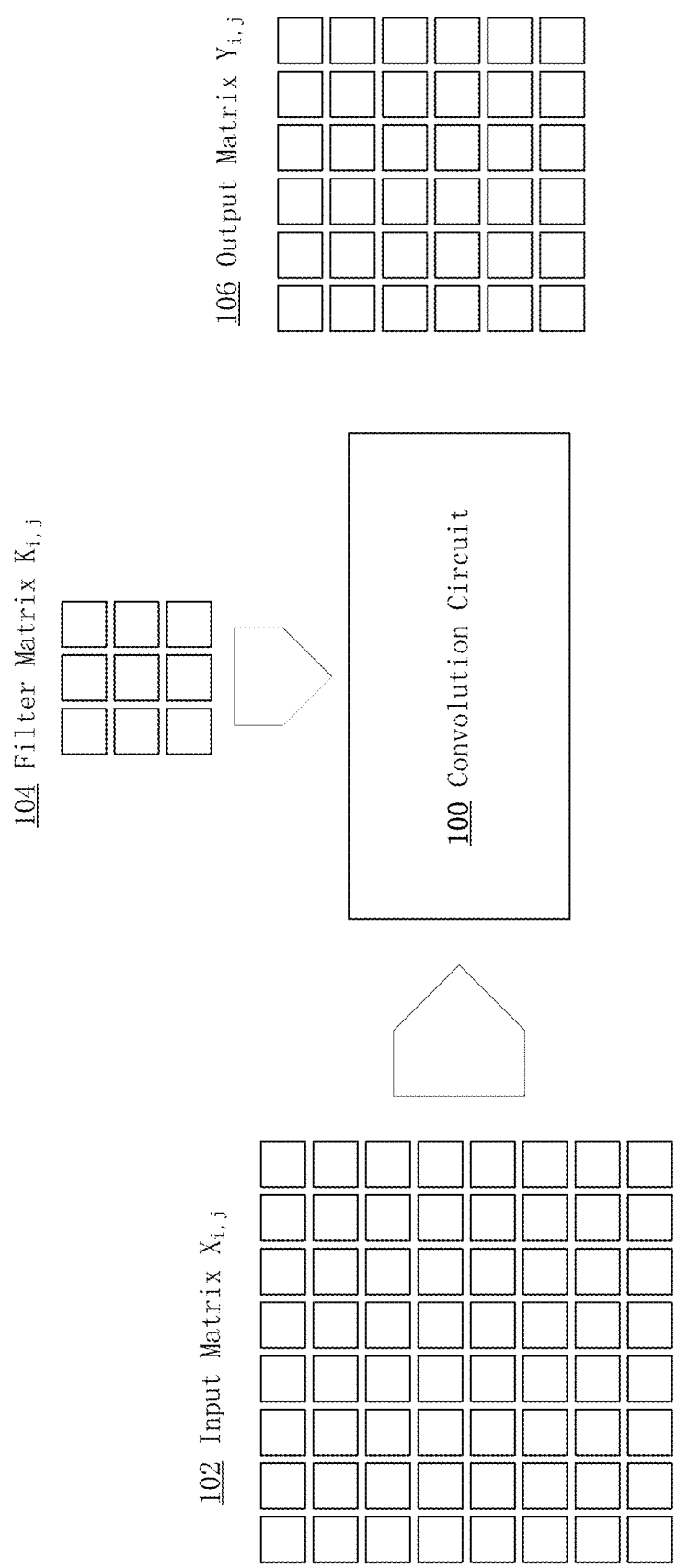

FIGS. 1A and 1B illustrate depthwise convolution. Convolution (112) extracts useful features from an input image 102 by applying a filter 104 (i.e., mask) to the input image 102. In mathematical terms, convolution is element-wise multiplication and addition (i.e., a dot product). Convolutional Neural Networks (CNNs) extract different features from the input through convolution using filter weights that are automatically learned during a training process. Convolution takes spatial relationship of pixels (in the input image) into account. For this reason, convolution is useful in computer vision applications that identify objects in an image based on spatial relationship between the objects and other image components.

In depthwise convolution, the filter has a single channel (a kernel). As illustrated in FIG. 1A, the mask or the kernel 104 is slid across the input image 102. At each position, the elements of the input image 102 in the sliding window of the mask 104 are multiplied with the corresponding elements of the mask 104 and the products are summed to produce a dot product, an element of the output image 106. For example, block 110 is convolved (112) with mask 104 to produce element 114, block 130 is convolved (132) with mask 104 to produce element 134, and block 120 is convolved (122) with mask 104 to produce element 124 of the output image 106.

As shown in FIG. 1A, the output image can be smaller in size compared to the input image. For example, an 8×8 input image 102 produces a 6×6 output image 106, because the mask 104 is 3×3 and is slid across the input image 102 until the last column of the mask 104 aligns with the last column of the input image 102. In some implementations, the input image 102 is padded with extra elements (e.g., two extra rows and two extra columns are added) so as to produce an output image of size equivalent to that of the input image. In some implementations, the padded elements are zero-valued. In some implementations, the padded elements are copies of a corresponding set of neighboring elements (e.g., last column is copied to produce additional columns, last row is replicated to produce additional rows). For the example, the input image that is 8×8 is padded up to form an 10×10 image and then convolved with a 3×3 mask to produce an 8×8 output image. In some implementations, the extra elements of the output image are added after the convolution operation.

Although, the foregoing examples describe the convolution operation using a stride of 1 through the input matrix (i.e., at each round of operation, the mask is slid across one row or one column of the input matrix), some convolution operations use a non-unit stride, striding multiple elements or skipping elements of the input matrix in subsequent operations. The output matrix produced by the convolution operation is accordingly smaller in size. In some implementations, the input matrix is appropriately adjusted (e.g., padded) to produce an output matrix that is equivalent in size to the input matrix.

FIG. 1B illustrates a convolution circuit 100 that performs depthwise convolution operations on an input data array arranged as an input matrix X (e.g., a matrix representation of the input image 102 from FIG. 1A; subscripts i and j are used to denote the matrix representation) using a filter matrix K (a matrix representation of the mask 104) to produce an output data array arranged as an output matrix Y (a matrix representation of the output 106).

Figure 2A:
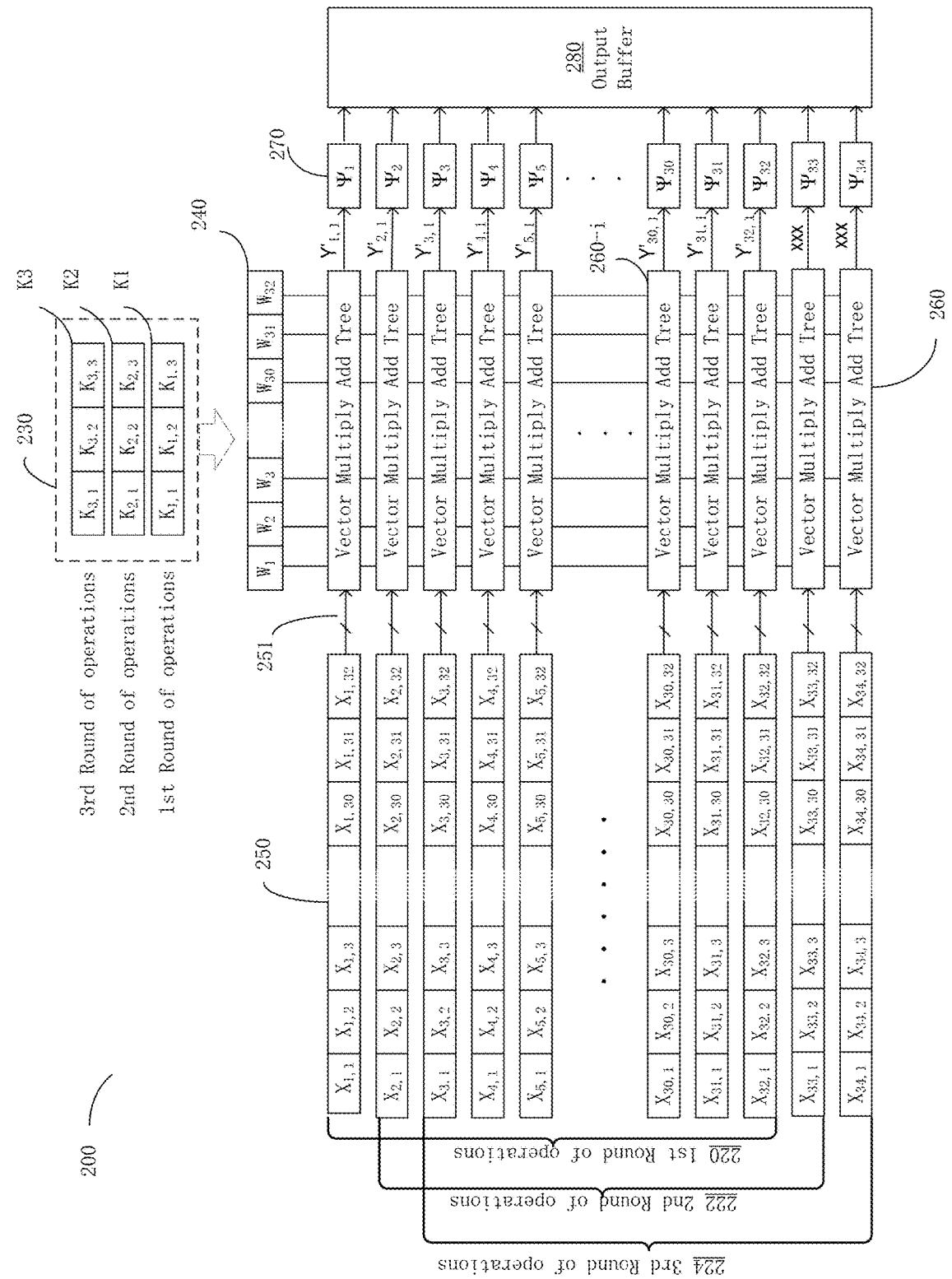
FIG. 2A is a block diagram illustrating a circuit for computing depthwise convolution, according to some implementations.

FIG. 2A is a block diagram illustrating a circuit for computing depthwise convolution, according to some implementations. Circuit 200 shown in FIG. 2A includes an array of input registers 250 configured to hold an input matrix (e.g., input matrix 102). The input matrix includes a plurality of input vectors each having a set of input data elements. For example, the input matrix in FIG. 2A includes 34 input vectors (input vector $X_1$, with input data elements $X_{1,1}$, $X_{1,2}$, ..., $X_{1,32}$, input vector $X_2$, with input data elements $X_{2,1}$, $X_{2,2}$, ..., $X_{2,32}$, ..., input vector $X_{34}$, with input data elements $X_{34,1}$, $X_{34,2}$, ..., $X_{34,32}$). The array of input registers 250 includes a plurality of groups of input registers, and each group of input registers is configured to hold a respective input vector. For example, in FIG. 2A, the array of input registers 250 includes a first group of input registers to hold input vector $X_1$, a second group of input registers to hold input vector $X_2$, and so on.

The circuit also includes a first buffer 230 configured to buffer a filter matrix (e.g., kernel 104) that includes a plurality of rows of filter elements (e.g., a first row $K_1$, a second row $K_2$, and a third row $K_3$), according to some implementations.

The circuit 200 shown in FIG. 2A further includes a plurality of subcircuits 260. A respective subcircuit of the plurality of subcircuits 260 has a first set of inputs coupled to respective input registers in a corresponding group of input registers (shown by the connections 251 to the respective input registers 250), and a second set of inputs configured to receive in parallel a set of weight elements (shown by the connection to the weights 240). The circuit 200 also includes a set of weight holders 240 configured to hold the set of weight elements, shown as $W_1$, $W_2$, $W_3$, ..., $W_{30}$, $W_{31}$, $W_{32}$. The set of weight elements includes a selected row of filter elements in a filter matrix K (e.g., kernel 104) and at least one zero element. The number of zero elements in the at least one zero element depend on the size of each input vector. The filter matrix K includes a plurality of rows of filter elements (e.g., $K_1$, $K_2$, and $K_3$).

Figure 2C:
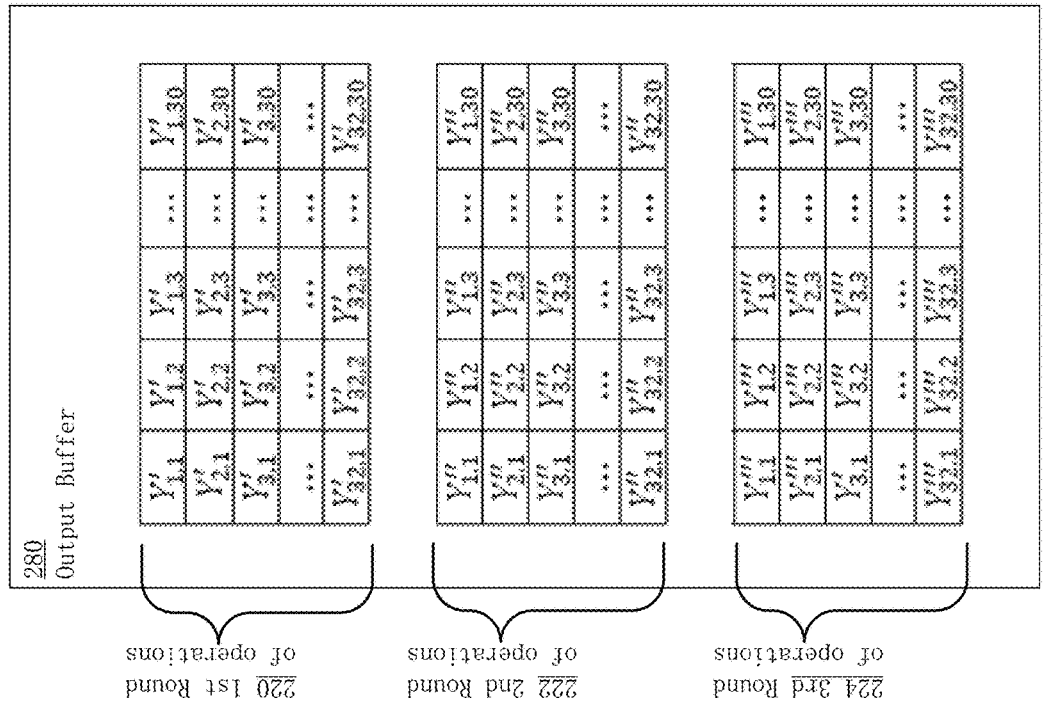
FIGS. 2B and 2C are tables illustrating intermediate results while computing depthwise convolution, according to various implementations.
Figure 2B:
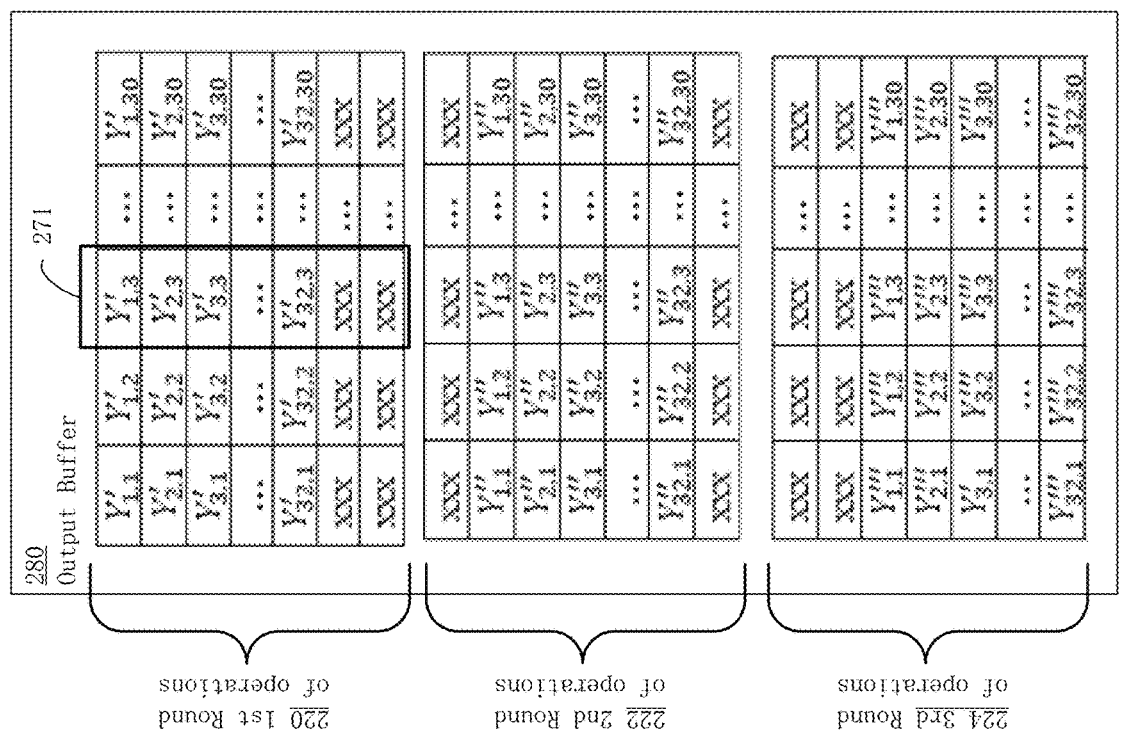

In some implementations, the circuit 200 is configured to generate an intermediate data array during each round of a plurality of rounds of operations corresponding to respective rows of the plurality of rows of the filter matrix K. For example, in FIG. 2A, the first row $K_1$ of kernel matrix K is used during a first round of operations 220, the second row $K_2$ of kernel matrix K is used during a second round of operations 222, and the third row $K_3$ of kernel matrix K is used during a third round of operations 224, according to some implementations. For example, in FIG. 2A, at the beginning of the first round of operations 220, weight holder 240 holds the first row $K_1$ of kernel matrix K as the first three weight elements, $W_1$, $W_2$, $W_3$, followed by 29 zero-valued elements, totaling 32 elements. The plurality of subcircuits 260 is configured to operate in parallel to generate an intermediate data array corresponding to the selected row of filter elements. For example, as shown in FIGS. 2B and 2C, the subcircuits 260 produce a first intermediate data array Y' corresponding to the first row $K_1$ of kernel matrix K in the first round of operations 220, a second intermediate data array Y'' corresponding to the second row $K_2$ of kernel matrix K in the second round of operations 222, and a third intermediate data array Y''' corresponding to the third row $K_3$ of kernel matrix K in the third round of operations 224. The intermediate data arrays are stored in a second buffer 280 (shown as output buffer 280 in FIGS. 2B and 2C).

In some implementations, each intermediate data array includes a plurality of sets (or columns) of intermediate data elements (e.g., set of column 271 shown in FIG. 2B) generated successively in a plurality of successive operations in a corresponding round of operations of operations (e.g., 1st round of operations 220). A respective set of intermediate data elements is generated in parallel by at least a subset of the plurality of subcircuits 260 and buffered at first in a set of buffers 270 (e.g., $\Psi_1$, $\Psi_2$, ..., $\Psi_{34}$). In some implementations, each of the buffers $\Psi_1$, $\Psi_2$, ..., $\Psi_{34}$ is a staging buffer. In some implementations, the staging buffer includes a pair of transmission buffers; while one of the pair of transmission buffers is receiving a newly generated intermediate data element from a corresponding subcircuit 260, the other one of the pair of transmission buffers holding a previously generated intermediate data element from the corresponding subcircuits 260, which has been transferred to the buffer 280, is deleting the previous transmission so as to be ready for the next operation.

FIG. 2A corresponds to a circuit configuration whereby the input registers 250 hold the rows of the input matrix X and two additional rows of 0 elements. For example, in FIG. 2A, the groups of input registers 250 hold rows 1 through 32 of the input matrix X and two additional rows (e.g., row 33 and 34) of filler elements (e.g., zero elements). In some implementations, the values held by the input registers are pre-loaded before the first round of operations of the three rounds of operations 220, 222, and 224. In some implementations, the plurality of subcircuits 260 operate in parallel to produce a set of intermediate data elements and two additional outputs (shown as XXX in FIG. 2B) and transmit in parallel the set of intermediate data elements and the two additional outputs to the set of buffers 270 ($\Psi_1$, $\Psi_2$, ..., $\Psi_{34}$), which subsequently transfer the set of intermediate data elements and the two additional outputs to the second buffer 280. In some implementations, as shown in FIG. 2C, only the set of intermediate data elements are transferred to the second buffer 280, i.e., the two additional outputs from those subcircuits not used to output the intermediate data elements are ignored.

Figure 2D:
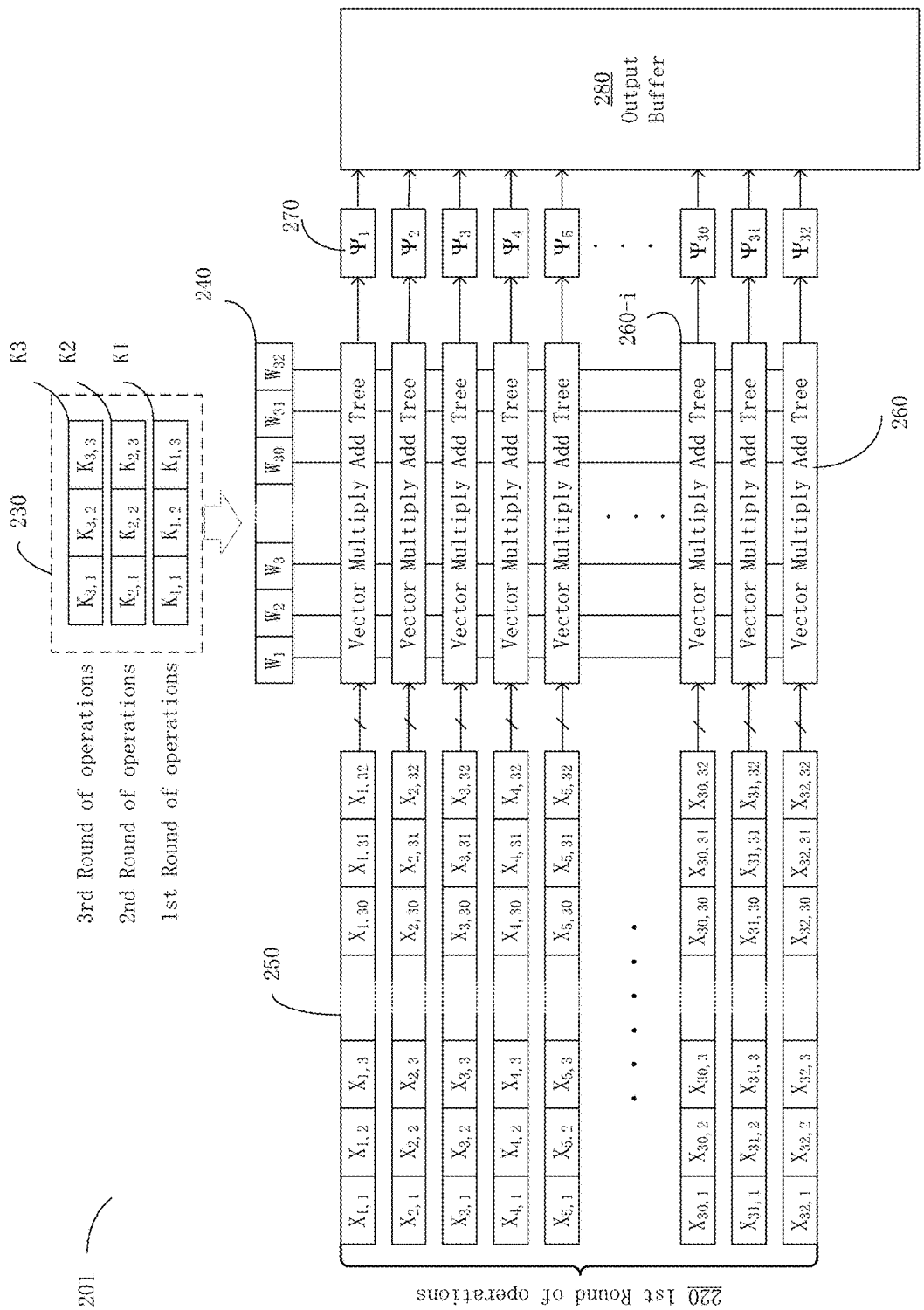
FIGS. 2D-2G are block diagrams illustrating circuits for computing depthwise convolution, according to some implementations.
Figure 2E:
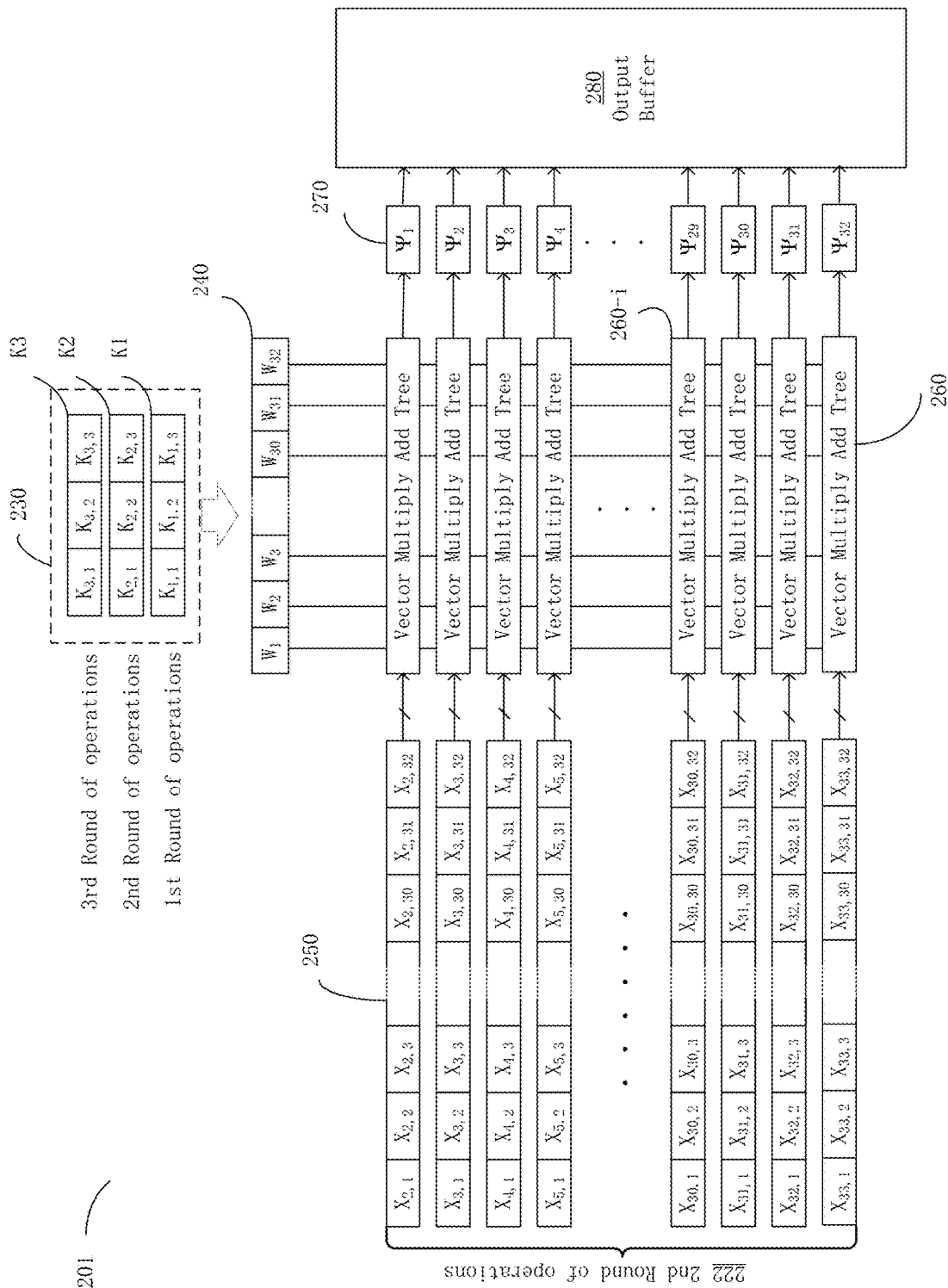
Figure 2F:
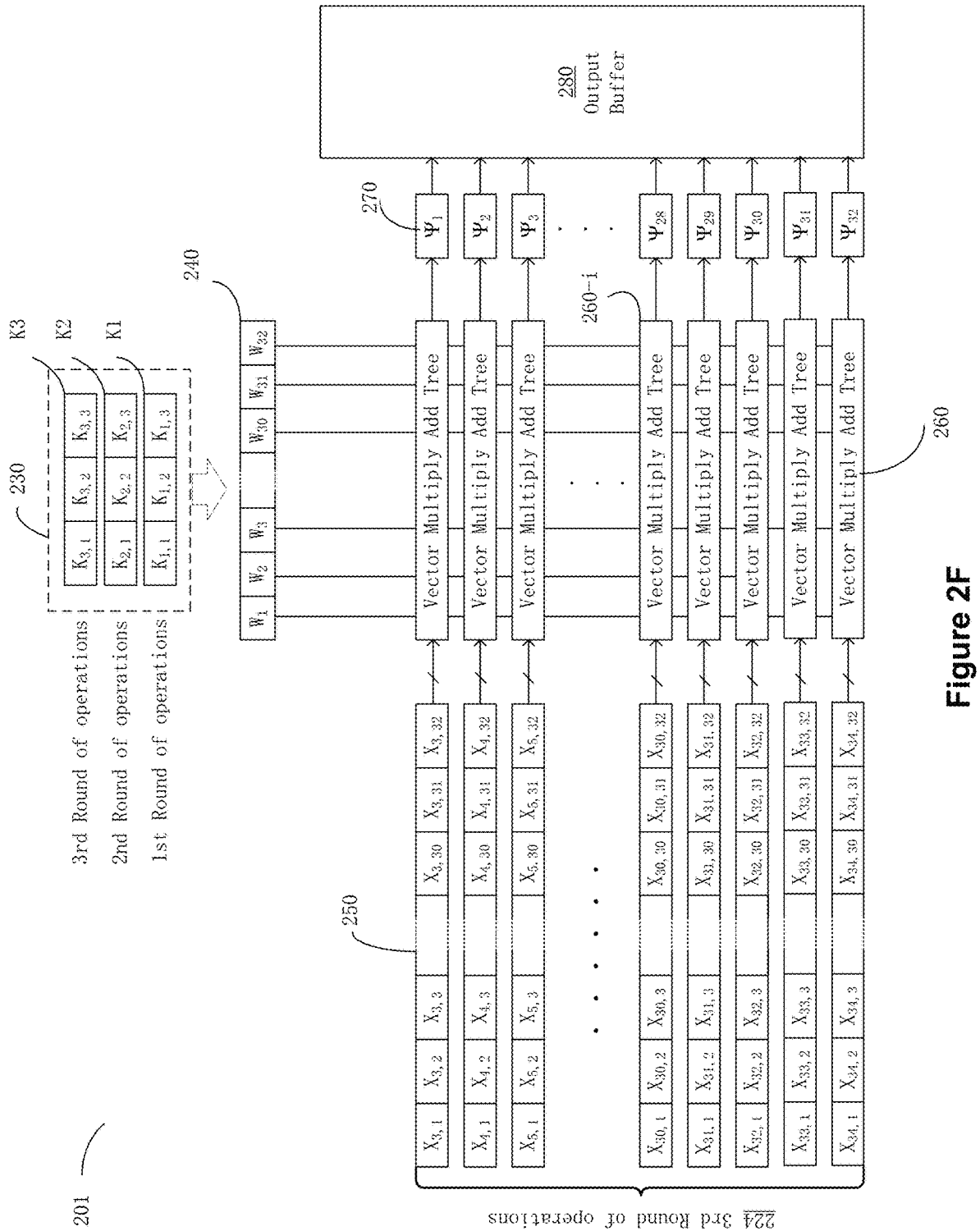

FIGS. 2D-2F show another electronic circuit 201, in which the number of groups of registers in the plurality of groups of input registers and the number of subcircuits in the plurality of subcircuits are the same as the number of rows in the input matrix (e.g., 32 rows), each group of input registers 250 to hold a different row of the input matrix X for each round of operation (e.g., rounds of operations 220, 222, and 224), according to some implementations. As shown, each subcircuit 260 is coupled to and receives input from a respective group of input registers 250. FIG. 2D corresponds to a first round of operations 220 during which the 32 groups of input registers 250 hold rows 1 through row 32 of the input matrix X, respectively. FIG. 2E corresponds to a second round of operations 222 during which the 32 groups of input registers 250 hold rows 2 through row 33 of the input matrix X, respectively. And, FIG. 2F corresponds to a third round of operations 224 during which the 32 groups of input registers 250 hold rows 3 through row 34 of the input matrix X, respectively. As illustrated in FIGS. 2D-2F, during each round of operation, the plurality of subcircuits 260 produce the plurality of intermediate data elements that are buffered in buffers 270 ($\Psi_1$, $\Psi_2$, ..., $\Psi_{32}$). As discussed later in reference to FIG. 4B, a module (e.g., memory module 286) transfers (e.g., after extracting individual data elements Y from the intermediate data elements W) the data elements and updates a memory (e.g., memory 284) storing the various intermediate data values, according to some implementations. The circuit 201 also includes a second buffer 280 configured to buffer the intermediate data array, as shown in FIG. 2F.

Figure 2G:
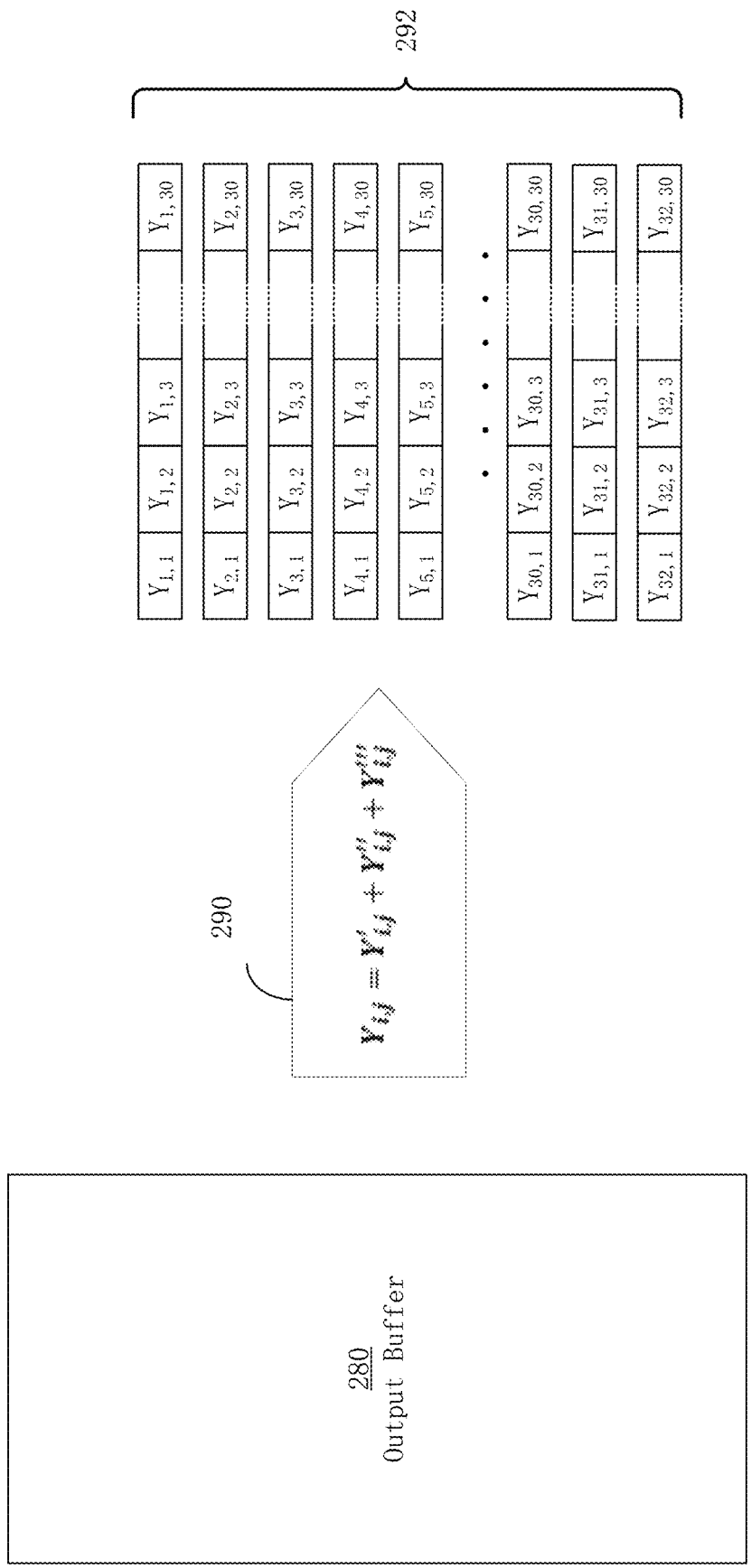

Referring to FIG. 2G, a summing module 290 is coupled to the second buffer 280 and configured to generate an output matrix 292 (e.g., matrix Y 106) by summing the plurality of intermediate data arrays corresponding to respective rows of the plurality of rows of filter elements K. In some implementations, the summing module 290 is a parallel adder that sums each (or a subset) of the corresponding set of intermediate data to concurrently compute each output matrix element. In some implementations, the summing module 290 is implemented using serial adder circuits.

Figure 3A:
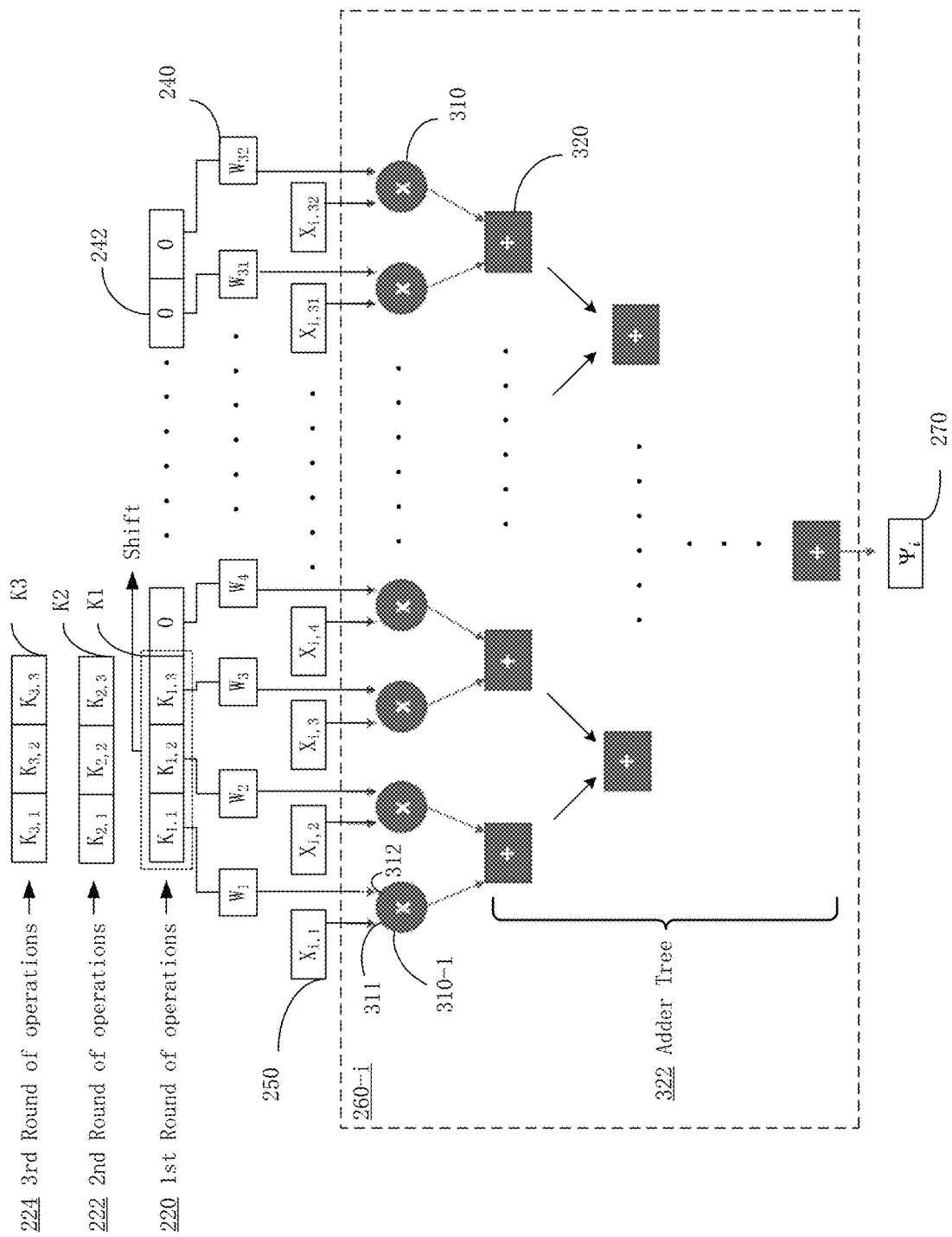
FIGS. 3A-3C are block diagrams illustrating an electronic circuit that computes intermediate sums using a vector multiply add tree, according to some implementations.
Figure 3B:
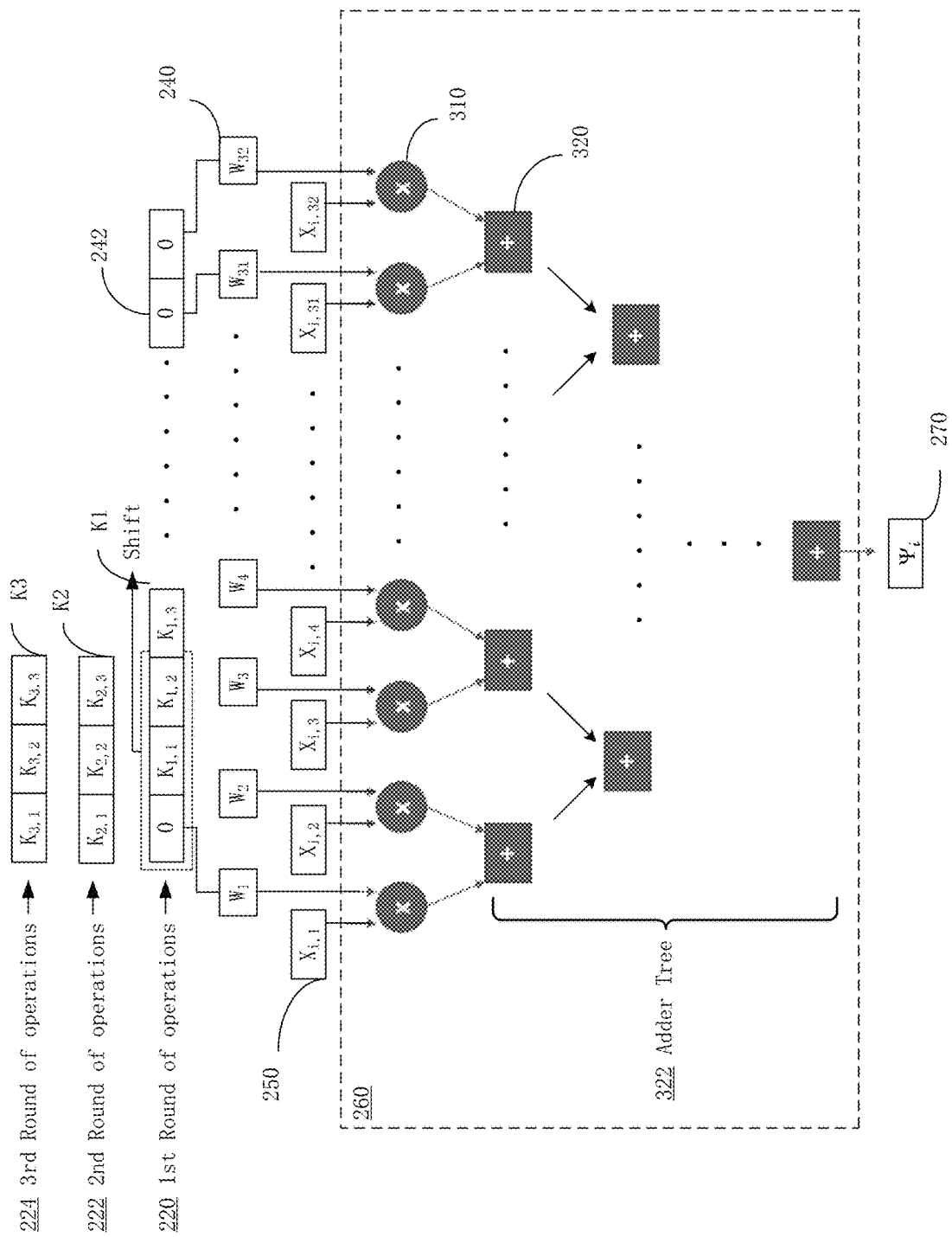
Figure 3C:
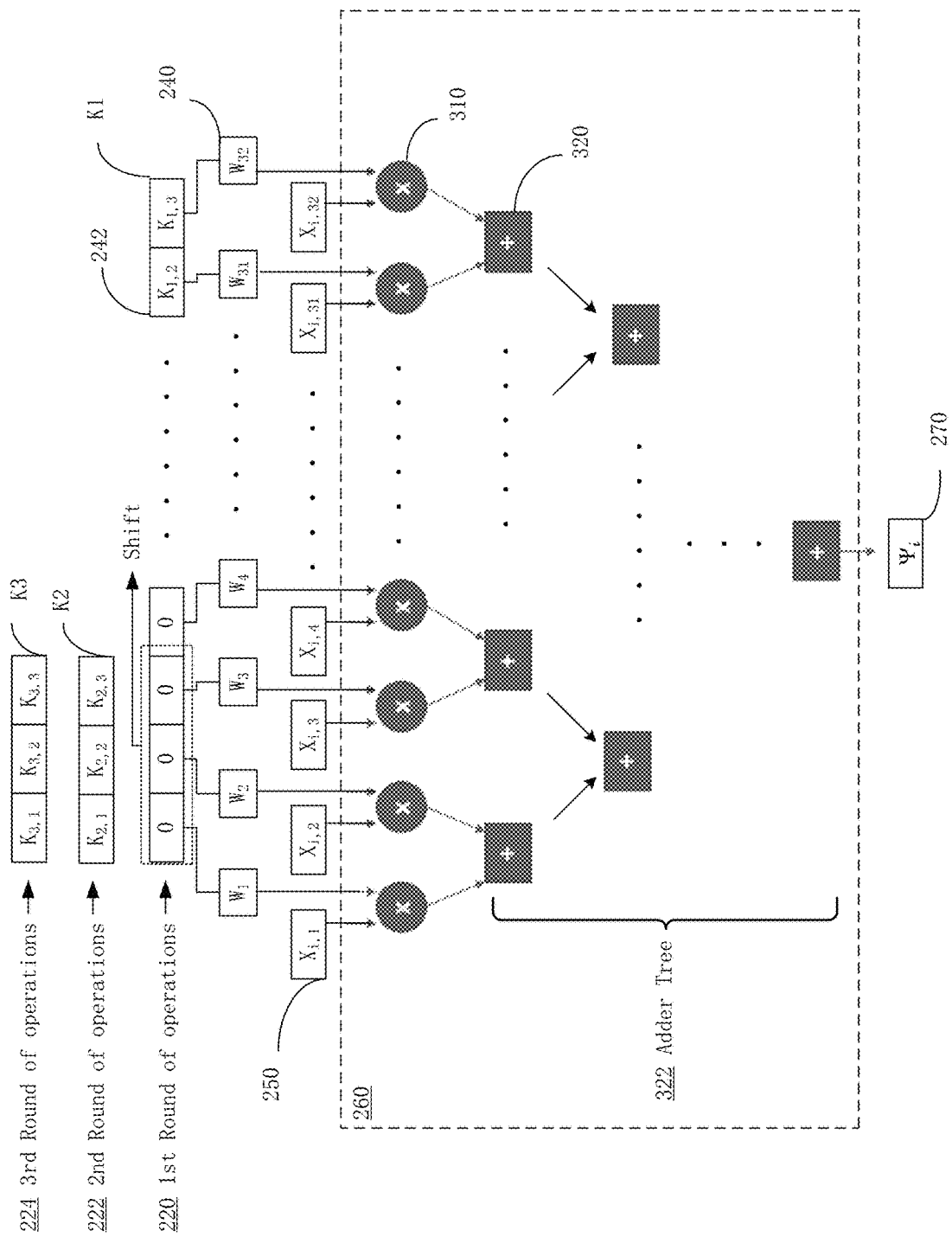

FIG. 3A is a schematic diagram illustrating an exemplary implementation of a subcircuit 260 (e.g., subcircuit 260-$i$) according to some implementations. As shown in FIG. 3A, in some implementations, subcircuit 260-$i$ includes a plurality of multiplier circuits 310 having a plurality of inputs and an adder tree 322 including a hierarchy of adder circuits 320. Each respective multiplier circuit (e.g., multiplier circuit 310-1) has two respective inputs 311 and 312, input 311 coupled to a respective input register (e.g., $X_{i,1}$) and input 312 coupled to a respective weight holder (e.g., $W_1$), and is configured to generate an output 313 that is the product of its two inputs 312 and 311. The adder tree 322 is configured to add up the outputs from the plurality of multiplier circuits 310 in a plurality of converging steps, as shown in FIG. 3A, and output the result to a corresponding buffer 270 (e.g., buffer $\Psi_i$). The selected row of filter elements (e.g., row K1, row K2, or row K3 of kernel K) is successively shifted among the set of weight elements so as to be received by different subsets of the plurality of inputs in different operations of the plurality of successive operations in each round of operations. For example, in FIGS. 3B and 3C, filter elements (e.g., weight elements $K_{1,1}$, $K_{1,2}$, and $K_{1,3}$) are successively shifted among the set of weight elements so as to be received by different subsets of the second set of inputs (shown by the arrows leading to the multiplier units 310) in different operations of the successive operations. In some implementations, the selected row of filter elements is successively shifted among the set of weight elements by a non-unit stride (e.g., for convolution with non-unit stride).

As discussed above in reference to FIG. 2A, in some implementations, the circuit further includes a set of weight holders (e.g., weight holders 240 $W_1$, $W_2$, ..., $W_{32}$) configured to hold the set of weight elements. The set of weight holders is configured to hold the selected row of filter elements in a respective subset of consecutive weight holders and to hold the at least one zero element in one or more weight holders other than the respective subset of consecutive weight holders for each operation of the plurality of successive operations. In some implementations, the set of weight holders is configured to successively shift the set of weight elements held therein such that the subset of consecutive weight holders holding the selected row of filter elements is successively shifted among the set of weight holders. For example, in FIG. 3A, the set of weight holders 240 holds the weight elements 242 and performs a shift operation, according to some implementations. In some implementations, the number of weight holders in the set of weight holders 240 equals the number of input registers 250 in each group of input registers.

Figure 4A:
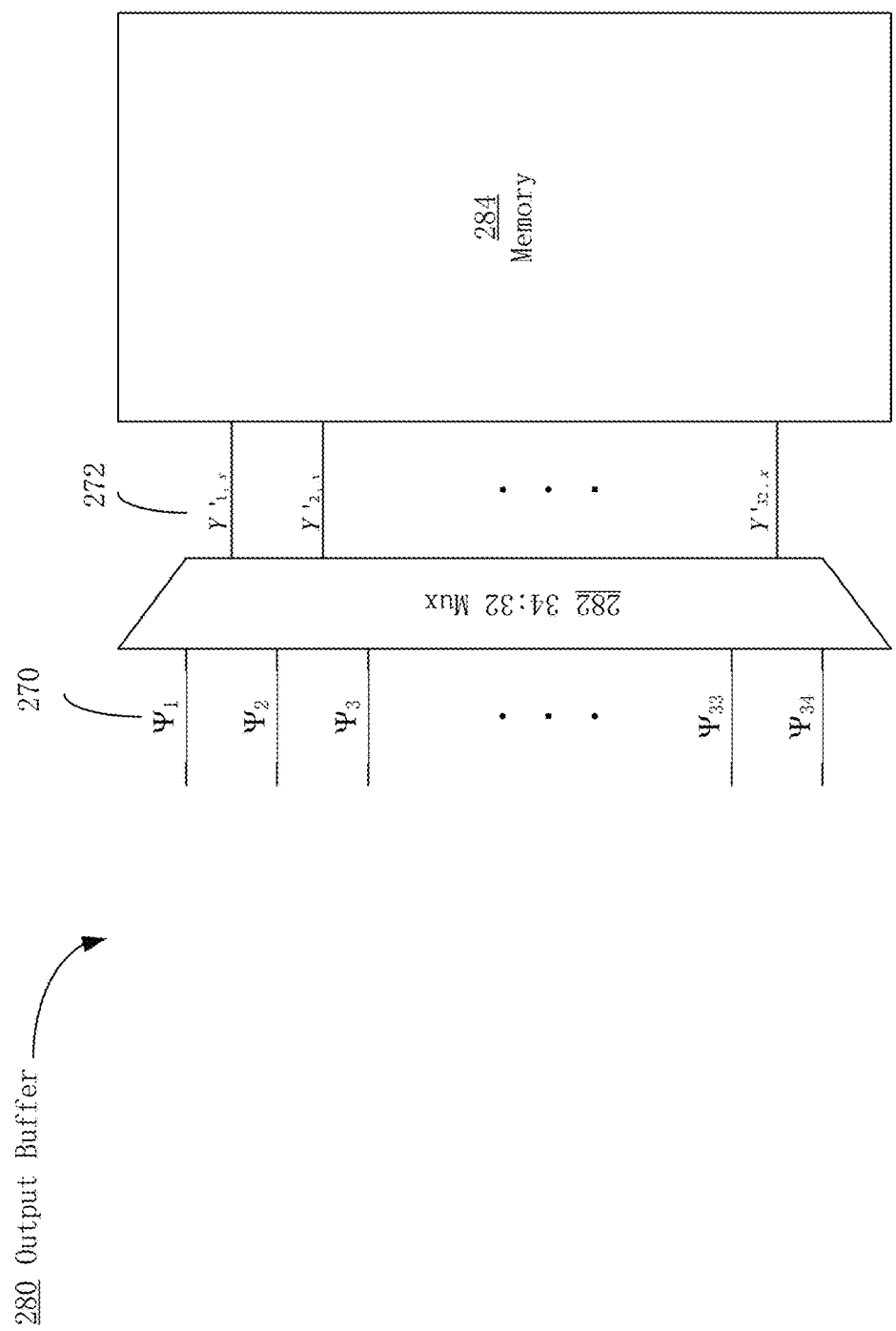
FIGS. 4A and 4B are block diagrams illustrating various configurations of an output buffer, according to some implementations.

Referring next to FIG. 4A, in some implementations, the second buffer (e.g., output buffer 280) includes a multiplexer (e.g., mux 282) that selects a subset of the intermediate data elements (e.g., after receiving the respective set of intermediate data elements $\Psi$ from subcircuits 260, selecting individual data elements Y from the intermediate data elements $\Psi$) to update a memory (e.g., memory 284) storing the various intermediate data values. To further explain, in FIG. 2A, the subcircuits 260 generate elements 1, 2, . . . , 32 of intermediate data elements 270 during a first round of operations 220, elements 2, 3, . . . , 33 of intermediate data elements 270 during a second round of operations 222, and elements 3, 4, . . . , 34 of intermediate data elements 270 during a third round of operations 224, according to some implementations. Mux 282 subsequently selects the particular set of 32 intermediate data elements generated during the round of operations from the possible 34 different intermediate data elements. As noted in FIGS. 4A and 4B, the set of intermediate data elements 272 corresponds to the position of filter elements as denoted by the subscript x in each of the elements (output from the Mux 282 in FIG. 4A and output from the Intermediate memory 286 in FIG. 4B), according to some implementations.

Figure 4B:
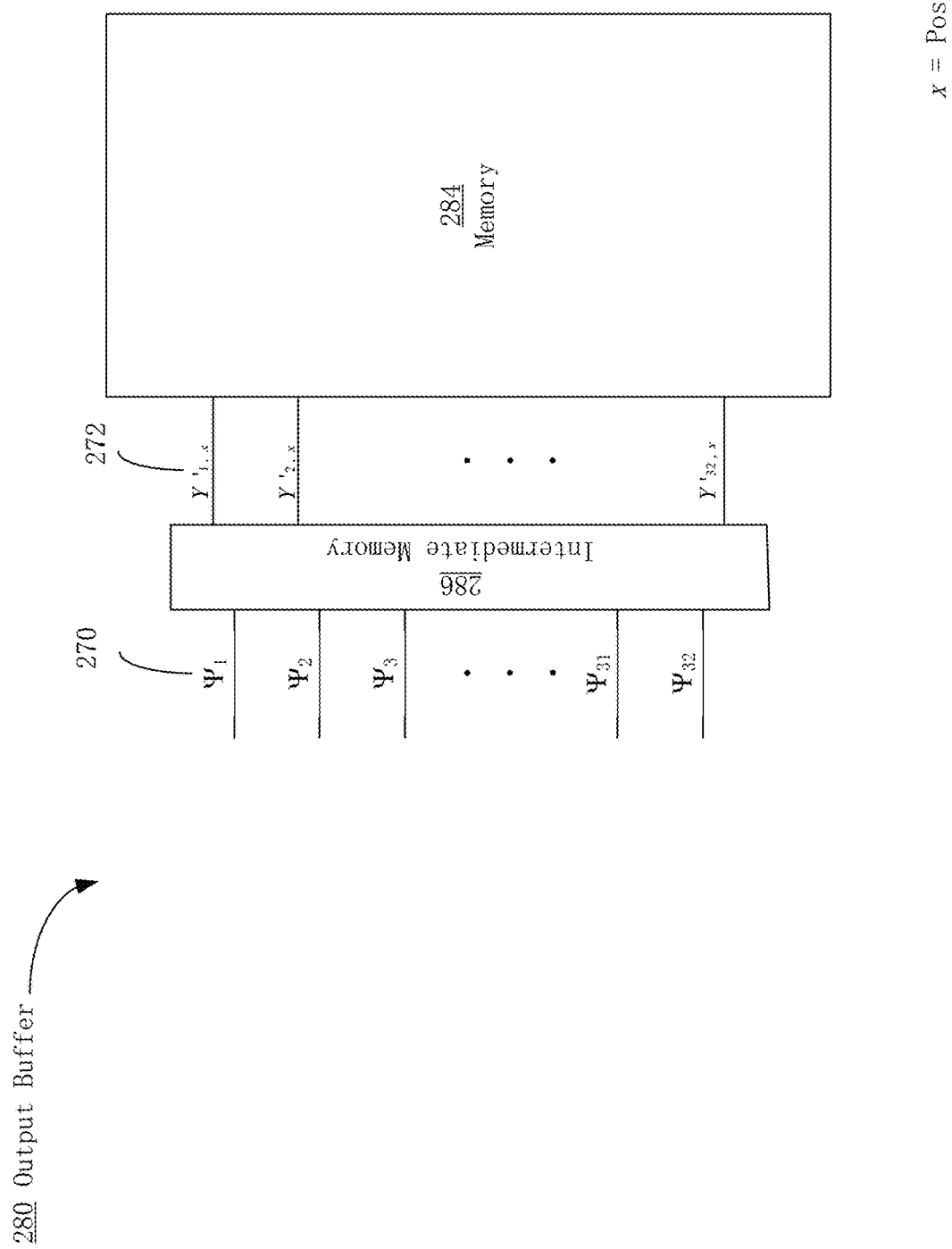

Referring to FIG. 4B, in some implementations, the second buffer (e.g., output buffer 280) includes a module (e.g., memory module 286) that transfers (e.g., after extracting individual data elements Y from the intermediate data elements $\Psi$) the data elements and updates a memory (e.g., memory 284) storing the various intermediate data values. In some implementations, the second buffer includes a set of buffer elements and a buffer array. For example, in FIG. 4B, the output buffer 280 includes an intermediate memory 286 (a set of buffer elements) and memory 284 (a buffer array). The set of buffer elements are configured to receive the respective set of intermediate data elements (e.g., elements 270 in FIGS. 4A and 4B) from the at least a subset of the plurality of subcircuits 260 and to transfer the respective set of intermediate data elements (e.g., elements 272) to the buffer array (e.g., memory 284). The buffer array is configured to hold the intermediate data array corresponding to the selected row of filter elements.

Figure 5A:
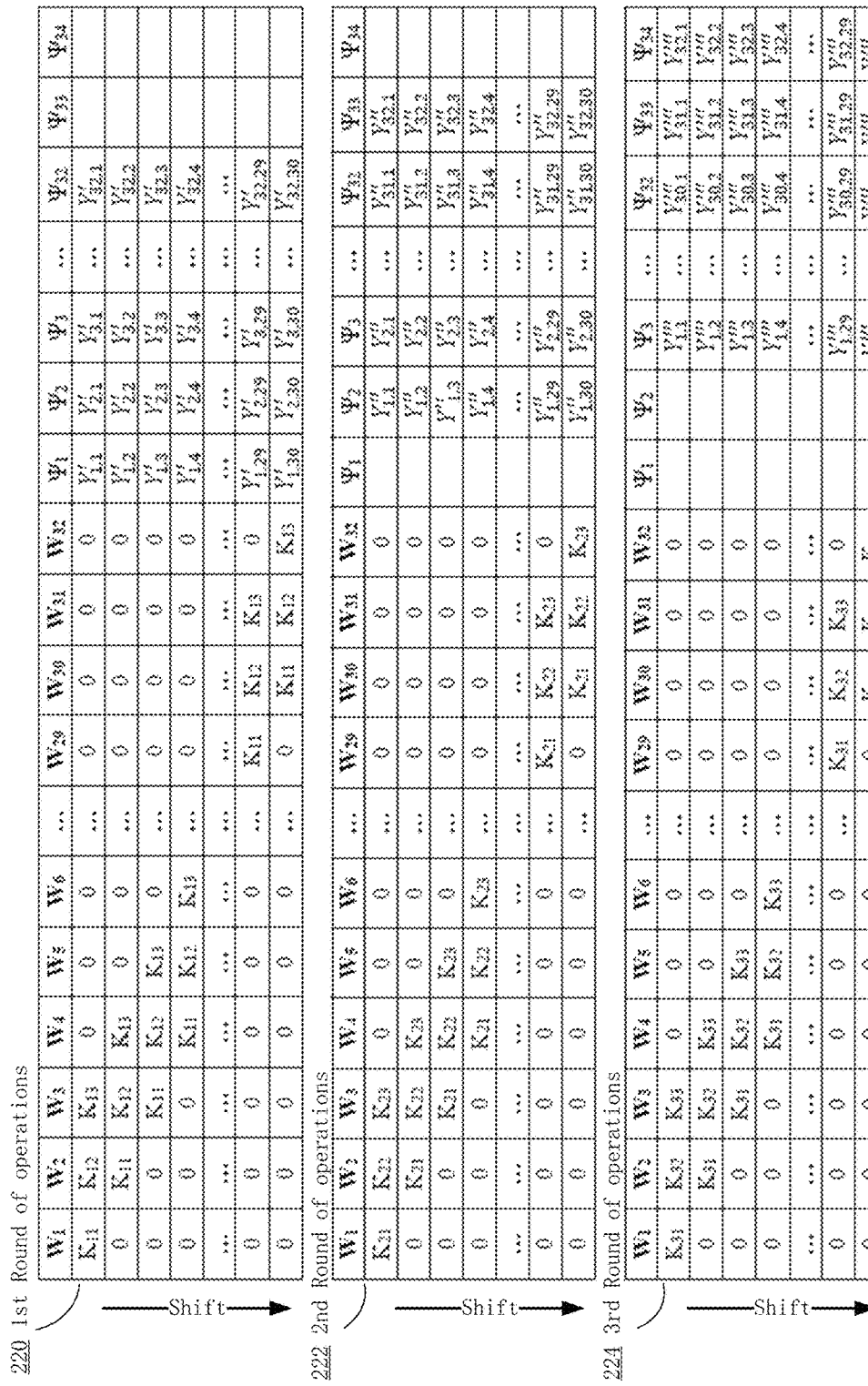
Figure 5B:
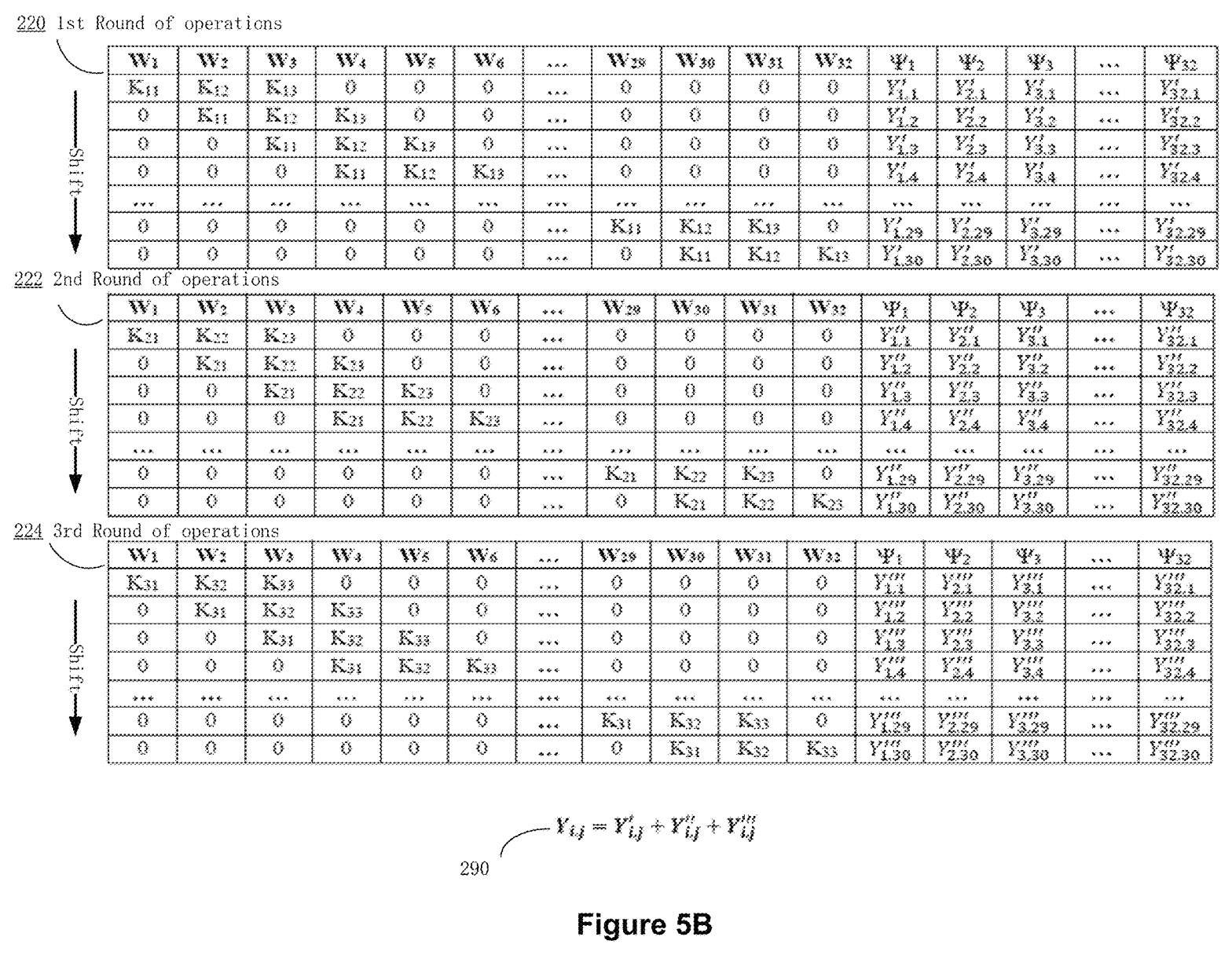

FIGS. 5A and 5B are tables illustrating inputs, intermediate results, and the various steps in calculating depthwise convolution, according to various implementations. FIG. 5A corresponds to the circuit configurations shown in FIGS. 2A and 4A, and FIG. 5B corresponds to the circuit configurations shown in FIGS. 2D-2F and 4B, respectively. Each of FIGS. 5A and 5B includes three tables corresponding, respectively, to the first round of operations 220, the second round of operations 222, and the third round of operations 224. Each table includes a plurality of rows corresponding, respectively, to a plurality of operations in the corresponding round of operations 220, 222, or 224. Each row of the plurality of rows lists the values of the weight elements $W_1$, $W_2$, $W_3$, . . . , $W_{30}$, $W_{31}$, $W_{32}$ held in the weight holders 240 during a corresponding operation, and intermediate data elements generated by the subcircuits 260 and held in the set of buffers 270 (e.g., $\Psi_1$, $\Psi_2$, . . . , $\Psi_{34}$ for FIG. 5A, or $\Psi_1$, $\Psi_2$, . . . , $\Psi_{32}$ for FIG. 5B) during the corresponding operation. As discussed above, the intermediate data elements held in the buffers 270 during a particular operation in a particular round of operations constitute a particular column of an intermediate data array corresponding to the particular round of operations.

In some implementations, the plurality of intermediate data arrays includes a first intermediate data array corresponding to a first row of filter elements, a second intermediate data array corresponding to a second row of filter elements, and a third intermediate data array corresponding to a third row of filter elements. For example, in FIG. 5A, buffers $\Psi_1$, $\Psi_2$, . . . , $\Psi_{32}$ buffer the intermediate data elements for a first intermediate array Y' corresponding to a first row of filter elements K1 ($K_{1,1}$, $K_{1,2}$, and $K_{1,3}$) for a first round of operations 220, buffers $\Psi_2$, $\Psi_3$, . . . , $\Psi_{33}$ buffer the intermediate data elements for a second intermediate array Y'' corresponding to a second row of filter elements K2 ($K_{2,1}$, $K_{2,2}$, and $K_{2,3}$) for a second round of operations 222, and buffers $\Psi_3$, $\Psi_4$, . . . , $\Psi_{34}$ buffer the intermediate data elements for a third intermediate array Y''' corresponding to a third row of filter elements K3 ($K_{3,1}$, $K_{3,2}$, and $K_{3,3}$) for a third round of operations 224. Note that, during each round of operations, the weights are successively shifted so that the filter elements occupy different positions in the weight holders 240 ($W_1$, $W_2$, . . . , $W_{32}$) for different operations in the round of operations. Each position of the filter elements produces a corresponding column (column 1, 2, . . . , 32) in the respective intermediate array, according to some implementations.

FIG. 5B corresponds to the circuit configurations shown in FIGS. 2D-2F and 4B, according to some implementations. In contrast to FIG. 5A, in FIG. 5B, a set of buffers $\Psi_1$, $\Psi_2$, . . . , $\Psi_{32}$ buffer the intermediate data elements for a first intermediate array Y' corresponding to a first row of filter elements K1 ($K_{1,1}$, $K_{1,2}$, and $K_{1,3}$) for a first round of operations 220, buffers the intermediate data elements for a second intermediate array Y'' corresponding to a second row of filter elements K2 ($K_{2,1}$, $K_{2,2}$, and $K_{2,3}$) for a second round of operations 222, and buffers the intermediate data elements for a third intermediate array Y''' corresponding to a third row of filter elements K3 ($K_{3,1}$, $K_{3,2}$, and $K_{3,3}$) for a third round of operations 224. Note that, during each round of operations, as in FIG. 5A, the weights are successively shifted so that the filter elements occupy different positions in the weight holders 240 ($W_1$, $W_2$, . . . , $W_{32}$) for different operations in the round of operations. And, each position of the filter elements produces a corresponding column (column 1, 2, . . . , 32) in the respective intermediate data array, according to some implementations.

FIGS. 6A-6D illustrate a flowchart representation of a method 600 for calculating depthwise convolution, according to some implementations. The method 600 uses vector matrix multiplication to calculate depthwise convolution, according to some implementations. The method 600 is performed (602) in an electronic circuit (e.g., circuits discussed above in reference to FIGS. 2A-2G, 3A-3C, 4A-4B, and 5A-5B). The method 600 includes loading (604) an input matrix (e.g., input matrix 102) into a plurality of groups of input registers (e.g., input registers 250). The input matrix includes a plurality of input vectors (e.g., $X_{1,1}$, $X_{1,2}$, . . . , $X_{1,32}$) and each group of input registers is configured to hold a respective input vector. The method 600 also includes applying (606) a filter matrix (e.g., filter matrix 104) to the plurality of input vectors to obtain a plurality of intermediate data arrays (e.g., intermediate data arrays Y', Y", and Y'") corresponding to respective rows of filter elements (e.g., row K1, row K2, and row K3) in the filter matrix. The method 700 further includes summing (612; e.g., summation 290, FIG. 2G) the plurality of intermediate data arrays to obtain an output matrix (e.g., matrix 292, FIG. 2G).

Applying (606) the filter matrix to the plurality of input vectors includes operating (608) a plurality of subcircuits (e.g., subcircuits 260) in parallel to generate an intermediate data array (e.g., arrays Y', Y", and Y'") corresponding to a selected row of filter elements (e.g., as described above in reference to FIG. 2A-2G). Each subcircuit of the plurality of subcircuits (e.g., circuit 260) has a first set of inputs coupled to respective input registers in a corresponding group of input registers (e.g., registers 250), and a second set of inputs configured to receive in parallel a set of weight elements (e.g., weights 240). The set of weight elements includes the selected row of filter elements (e.g., row K1, row K2, or row K3) and at least one zero element (e.g., a zero- or a special-valued element). The intermediate data array corresponding to the selected row of filter elements includes a plurality of sets of intermediate data elements (as shown in FIG. 5A or 5B, and as discussed above). A respective set of intermediate data elements (e.g., each row in tables shown in FIG. 5A or 5B) is generated in parallel by at least a subset of the plurality of subcircuits (e.g., circuits 260) upon receiving the selected row of filter elements at a respective subset of the second set of inputs in each of the subset of the plurality of subcircuits.

Figure 6A:
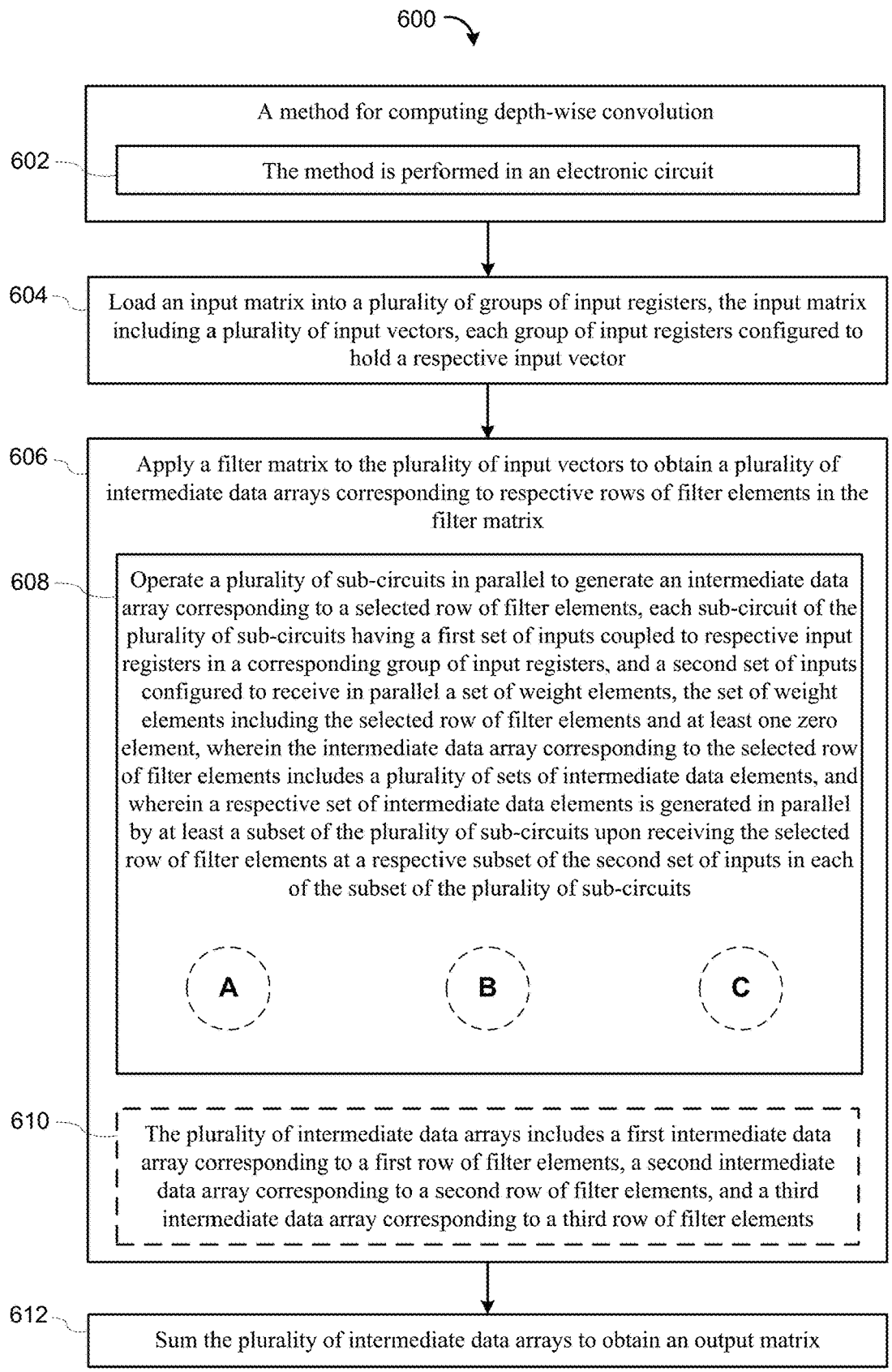
FIGS. 6A-6D illustrate a flowchart representation of a method for calculating depthwise convolution, according to some implementations.
Figure 6B:
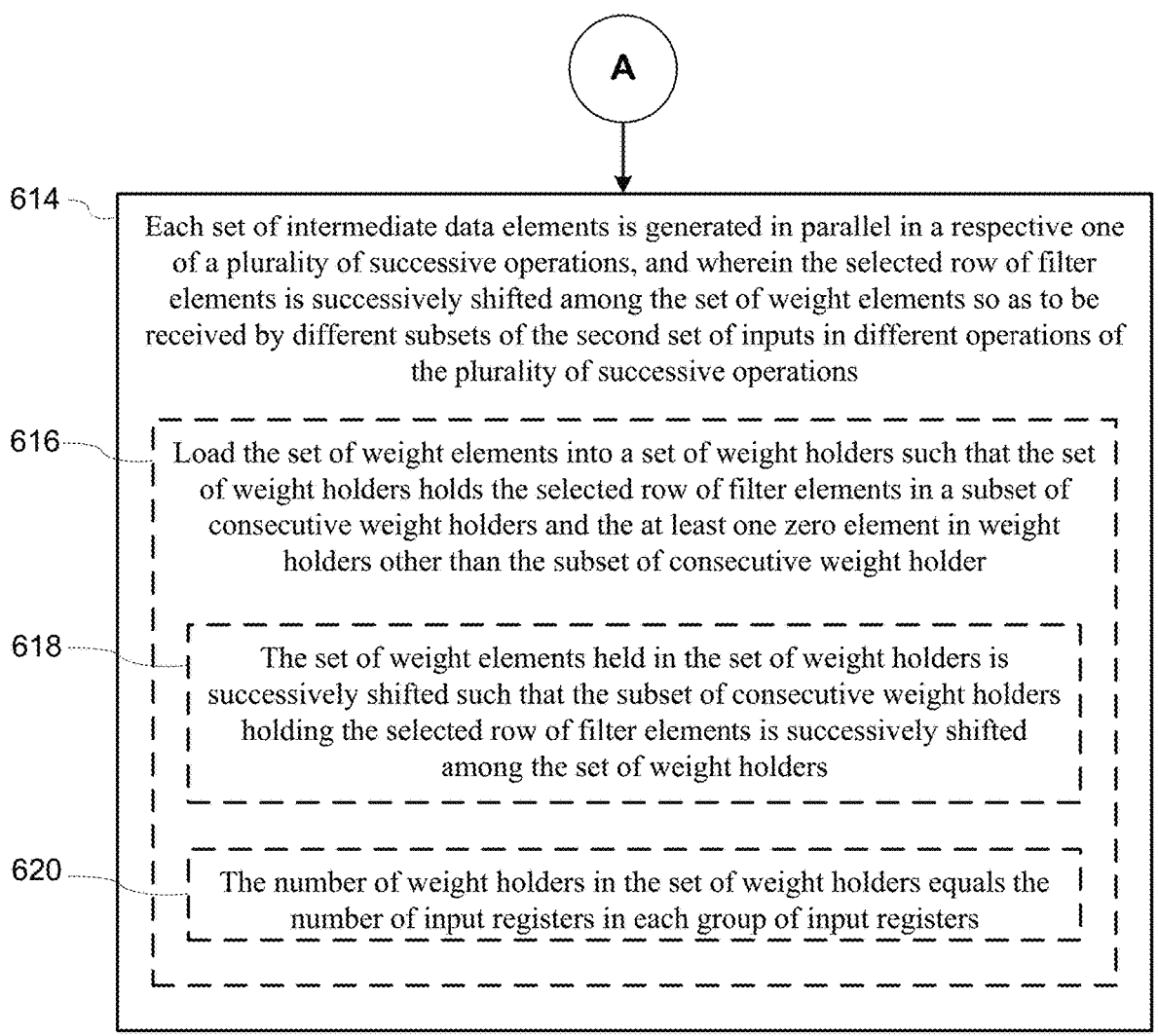

Referring next to FIG. 6B, in some implementations, each set of intermediate data elements (e.g., $\Psi_1, \Psi_2, \ldots, \Psi_{32}$) is generated (614) in parallel in a respective one of a plurality of successive operations (e.g., operations corresponding to round of operations 220). The selected row of filter elements is successively shifted among the set of weight elements so as to be received by different subsets of the second set of inputs in different operations of the plurality of successive operations. Examples of the operations were discussed above in reference to FIGS. 3A-3C. In some implementations, the selected row of filter elements is successively shifted among the set of weight elements by a non-unit stride. (e.g., for convolution with non-unit stride). In some implementations, the method 600 further includes loading (616) the set of weight elements into a set of weight holders (e.g., weight holders 240) such that the set of weight holders holds the selected row of filter elements in a subset of consecutive weight holders and the at least one zero element in weight holders other than the subset of consecutive weight holders. In some implementations, the set of weight elements held in the set of weight holders is successively shifted (618) such that the subset of consecutive weight holders holding the selected row of filter elements is successively shifted among the set of weight holders. In some implementations, the number of weight holders equals (620) the number of input registers in each group of input registers. In FIG. 3A, for example, the number of weight holders 240 (32 in number) is equal to the number of input registers 250.

Figure 6C:
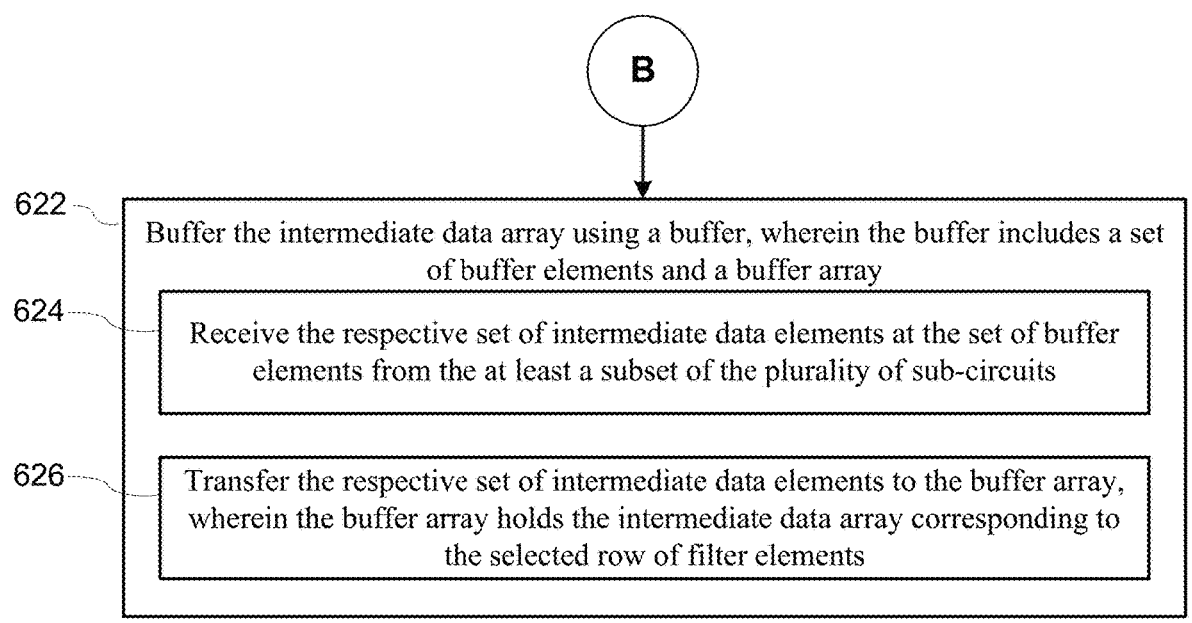

Referring next to FIG. 6C, in some implementations, the method 600 further includes buffering (622) the intermediate data array using a buffer that includes a set of buffer elements and a buffer array. The method further includes receiving (624) the respective set of intermediate data elements at the set of buffer elements from the at least a subset of the plurality of subcircuits; and transferring (626) the respective set of intermediate data elements to the buffer array. The buffer array holds the intermediate data array corresponding to the selected row of filter elements. Examples of these operations were discussed above in reference to output buffer 280 in FIGS. 4A and 4B.

Referring back to FIG. 6A, in some implementations, the plurality of intermediate data arrays includes (610) a first intermediate data array (e.g., Y') corresponding to a first row of filter elements, a second intermediate data array (e.g., Y") corresponding to a second row of filter elements, and a third intermediate data array (e.g., Y'") corresponding to a third row of filter elements.

Figure 6D:
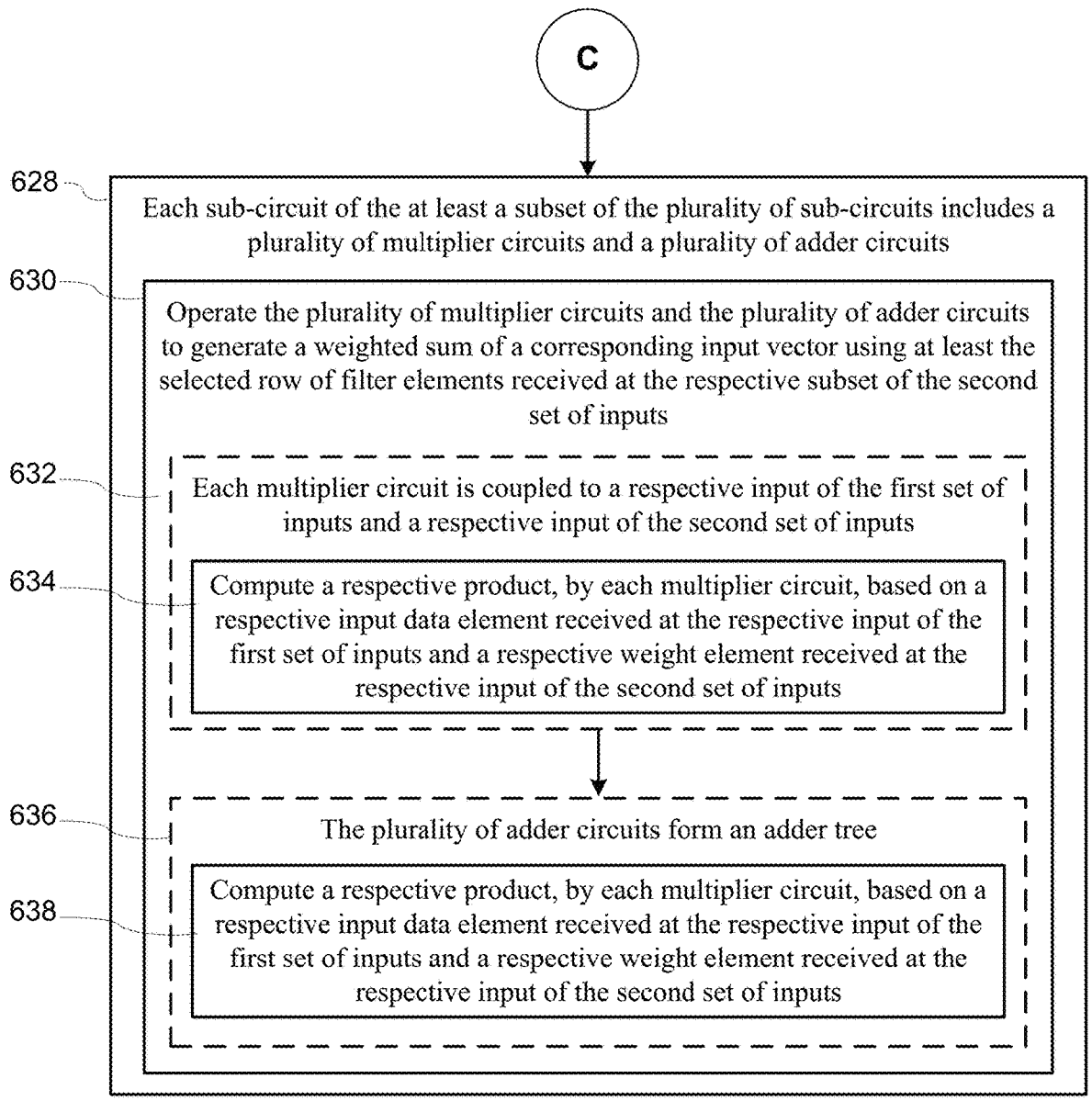

Referring next to FIG. 6D, in some implementations, each subcircuit of the at least a subset of the plurality of subcircuits includes (628) a plurality of multiplier circuits and a plurality of adder circuits. An example of a subcircuit 260-$i$ is shown in FIG. 3A discussed above. The method 600 further includes operating (630) the plurality of multiplier circuits (e.g., circuits 310) and the plurality of adder circuits (e.g., circuits 320) to generate a weighted sum (e.g., sum 270) of a corresponding input vector using at least the selected row of filter elements received at the respective subset of the second set of inputs. In some implementations, each multiplier circuit is coupled (632) to a respective input of the first set of inputs and a respective input of the second set of inputs. The method further includes computing (634) a respective product, by each multiplier circuit, based on a respective input data element received at the respective input of the first set of inputs and a respective weight element received at the respective input of the second set of inputs. The plurality of adder circuits form (636) an adder tree (e.g., adder tree 322). The method 700 further includes progressively summing up (638), by the plurality of adder circuits, outputs from the plurality of multiplier circuits to generate the weighted sum. Examples of these operations were discussed above in reference to subcircuit 260-$i$ in FIGS. 3A-3C.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A circuit for computing depthwise convolution, comprising:
    an array of input registers configured to hold an input matrix, the input matrix including a plurality of input vectors each having a set of input data elements, the array of input registers including a plurality of groups of input registers, each group of input registers configured to hold a respective input vector;

a first buffer configured to buffer a filter matrix, the filter matrix including a plurality of rows of filter elements;

a plurality of subcircuits, a respective subcircuit of the plurality of subcircuits having a first set of inputs coupled to respective input registers in a corresponding group of input registers, and a second set of inputs configured to receive in parallel a set of weight elements, the set of weight elements including a selected row of filter elements of the plurality of rows of filter elements and at least one zero element, wherein the plurality of subcircuits are configured to operate in parallel to generate an intermediate data array corresponding to the selected row of filter elements, the intermediate data array including a plurality of sets of intermediate data elements, wherein a respective set of intermediate data elements is generated in parallel by at least a subset of the plurality of subcircuits upon receiving the selected row of filter elements at a respective subset of the second set of inputs in each of the subset of the plurality of subcircuits, wherein each set of intermediate data elements is generated in parallel in a respective one of a plurality of successive operations, and wherein the selected row of filter elements is successively shifted among the set of weight elements so as to be received by different subsets of the second set of inputs in different operations of the plurality of successive operations;

a second buffer configured to buffer the intermediate data array; and a summing module coupled to the second buffer and configured to generate an output matrix by summing a plurality of intermediate data arrays, the plurality of intermediate data arrays corresponding to respective rows of the plurality of rows of filter elements.

2. The circuit of claim 1, wherein the selected row of filter elements is successively shifted among the set of weight elements by a non-unit stride.

3. The circuit of claim 1, further comprising a set of weight holders configured to hold the set of weight elements, wherein the set of weight holders is configured to hold the selected row of filter elements in a respective subset of consecutive weight holders and to hold the at least one zero element in one or more weight holders other than the respective subset of consecutive weight holders for each operation of the plurality of successive operations.

4. The circuit of claim 3, wherein the set of weight holders is configured to successively shift the set of weight elements held therein such that the subset of consecutive weight holders holding the selected row of filter elements is successively shifted among the set of weight holders.

5. The circuit of claim 3, wherein the number of weight holders in the set of weight holders equals the number of input registers in each group of input registers.

6. The circuit of claim 1, wherein the second buffer includes a set of buffer elements and a buffer array, wherein the set of buffer elements are configured to receive the respective set of intermediate data elements from the at least a subset of the plurality of subcircuits and to transfer the respective set of intermediate data elements to the buffer array, and wherein the buffer array is configured to hold the intermediate data array corresponding to the selected row of filter elements.

7. The circuit of claim 1, wherein the plurality of intermediate data arrays includes a first intermediate data array corresponding to a first row of filter elements, a second intermediate data array corresponding to a second row of filter elements, and a third intermediate data array corresponding to a third row of filter elements.

8. The circuit of claim 1, wherein each subcircuit of the at least a subset of the plurality of subcircuits includes a plurality of multiplier circuits and a plurality of adder circuits to generate a weighted sum of a corresponding input vector using at least the selected row of filter elements received at the respective subset of the second set of inputs.

9. The circuit of claim 8, wherein:
each multiplier circuit is coupled to a respective input of the first set of inputs and a respective input of the second set of inputs, and configured to compute and output a respective product based on a respective input data element received at the respective input of the first set of inputs and a respective weight element received at the respective input of the second set of inputs; and the plurality of adder circuits form an adder tree, to progressively sum up outputs from the plurality of multiplier circuits to generate the weighted sum.

10. A method performed in an electronic circuit, comprising:

loading an input matrix into a plurality of groups of input registers, the input matrix including a plurality of input vectors, each group of input registers configured to hold a respective input vector;

applying a filter matrix to the plurality of input vectors to obtain a plurality of intermediate data arrays corresponding to respective rows of filter elements in the filter matrix; and summing the plurality of intermediate data arrays to obtain an output matrix;

wherein applying the filter matrix to the plurality of input vectors includes operating a plurality of sub circuits in parallel to generate an intermediate data array corresponding to a selected row of filter elements, each subcircuit of the plurality of subcircuits having a first set of inputs coupled to respective input registers in a corresponding group of input registers, and a second set of inputs configured to receive in parallel a set of weight elements, the set of weight elements including the selected row of filter elements and at least one zero element, wherein the intermediate data array corresponding to the selected row of filter elements includes a plurality of sets of intermediate data elements, wherein a respective set of intermediate data elements is generated in parallel by at least a subset of the plurality of subcircuits upon receiving the selected row of filter elements at a respective subset of the second set of inputs in each of the subset of the plurality of subcircuits, wherein each set of intermediate data elements is generated in parallel in a respective one of a plurality of successive operations, and wherein the selected row of filter elements is successively shifted among the set of weight elements so as to be received by different subsets of the second set of inputs in different operations of the plurality of successive operations.

11. The method of claim 10, wherein the selected row of filter elements is successively shifted among the set of weight elements by a non-unit stride.

12. The method of claim 10, further comprising loading the set of weight elements into a set of weight holders such that the set of weight holders holds the selected row of filter elements in a subset of consecutive weight holders and the at least one zero element in weight holders other than the subset of consecutive weight holders.

13. The method of claim 12, wherein the set of weight elements held in the set of weight holders is successively shifted such that the subset of consecutive weight holders holding the selected row of filter elements is successively shifted among the set of weight holders.

14. The method of claim 12, wherein the number of weight holders in the set of weight holders equals the number of input registers in each group of input registers.

15. The method of claim 10, further comprising buffering the intermediate data array using a buffer, wherein the buffer includes a set of buffer elements and a buffer array, the method further comprising:
 receiving the respective set of intermediate data elements at the set of buffer elements from the at least a subset of the plurality of subcircuits; and
 transferring the respective set of intermediate data elements to the buffer array, wherein the buffer array holds the intermediate data array corresponding to the selected row of filter elements.

16. The method of claim 10, wherein the plurality of intermediate data arrays includes a first intermediate data array corresponding to a first row of filter elements, a second intermediate data array corresponding to a second row of filter elements, and a third intermediate data array corresponding to a third row of filter elements.

17. The method of claim 10, wherein each subcircuit of the at least a subset of the plurality of subcircuits includes a plurality of multiplier circuits and a plurality of adder circuits, and the method further comprises operating the plurality of multiplier circuits and the plurality of adder circuits to generate a weighted sum of a corresponding input vector using at least the selected row of filter elements received at the respective subset of the second set of inputs.

18. The method of claim 17, wherein:
 each multiplier circuit is coupled to a respective input of the first set of inputs and a respective input of the second set of inputs, the method further comprising computing a respective product, by each multiplier circuit, based on a respective input data element received at the respective input of the first set of inputs and a respective weight element received at the respective input of the second set of inputs; and
 the plurality of adder circuits form an adder tree, the method further comprising progressively summing up, by the plurality of adder circuits, outputs from the plurality of multiplier circuits to generate the weighted sum.

19. The method of claim 10, including:
 receiving the selected row of filter elements in a first subset of the second set of inputs for a first successive operation;
 subsequent to receiving the selected row of filter elements in the first subset of the second set of inputs for the first successive operation, shifting the selected row of filter elements among the set of weight elements;
 subsequent to shifting the selected row of filter elements among the set of weight elements, receiving the selected row of filter elements in a second subset, distinct from the first subset, of the second set of inputs for a second successive operation that is subsequent to the first successive operation.

20. A circuit for computing depthwise convolution, comprising:
 an array of input registers configured to hold an input matrix, the input matrix including a plurality of input vectors each having a set of input data elements, the array of input registers including a plurality of groups of input registers, each group of input registers configured to hold a respective input vector;
 a first buffer configured to buffer a filter matrix, the filter matrix including a plurality of rows of filter elements;
 a plurality of subcircuits, a respective subcircuit of the plurality of subcircuits having a first set of inputs coupled to respective input registers in a corresponding group of input registers, and a second set of inputs configured to receive in parallel a set of weight elements, the set of weight elements including a selected row of filter elements of the plurality of rows of filter elements and at least one zero element, wherein a number of weight elements in the set of weight elements is greater than a number of filter elements in the selected row of filter elements, and the plurality of subcircuits are configured to operate in parallel to generate an intermediate data array corresponding to the selected row of filter elements, the intermediate data array including a plurality of sets of intermediate data elements, wherein a respective set of intermediate data elements is generated in parallel by at least a subset of the plurality of subcircuits upon receiving the selected row of filter elements at a respective subset of the second set of inputs in each of the subset of the plurality of subcircuits;
 a second buffer configured to buffer the intermediate data array; and
 a summing module coupled to the second buffer and configured to generate an output matrix by summing a plurality of intermediate data arrays, the plurality of intermediate data arrays corresponding to respective rows of the plurality of rows of filter elements.

* * * * *